(12) United States Patent
Iizuka et al.

(10) Patent No.: US 12,402,366 B2
(45) Date of Patent: Aug. 26, 2025

(54) SPIN QUBIT-TYPE SEMICONDUCTOR DEVICE AND INTEGRATED CIRCUIT THEREOF

(71) Applicant: NATIONAL INSTITUTE OF ADVANCED INDUSTRIAL SCIENCE AND TECHNOLOGY, Tokyo (JP)

(72) Inventors: Shota Iizuka, Ibaraki (JP); Takahiro Mori, Ibaraki (JP); Kimihiko Kato, Ibaraki (JP); Atsushi Yagishita, Ibaraki (JP); Tetsuya Ueda, Ibaraki (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 445 days.

(21) Appl. No.: 18/071,173

(22) Filed: Nov. 29, 2022

(65) Prior Publication Data
US 2023/0200261 A1 Jun. 22, 2023

(30) Foreign Application Priority Data

Nov. 30, 2021 (JP) ................................. 2021-194565

(51) Int. Cl.
*H10D 48/00* (2025.01)
*H10D 30/40* (2025.01)

(52) U.S. Cl.
CPC ......... *H10D 48/385* (2025.01); *H10D 30/402* (2025.01); *H10D 48/3835* (2025.01)

(58) Field of Classification Search
CPC ............... H10D 48/385; H10D 30/402; H10D 48/3835; B82Y 10/00
See application file for complete search history.

(56) References Cited

U.S. PATENT DOCUMENTS

2021/0305480 A1* 9/2021 Holmes .............. G01R 33/0358

OTHER PUBLICATIONS

Yasuhiro Tokura et al., "Coherent Single Electron Spin Control in a Slanting Zeeman Field", Physical Review Letters, Published Jan. 30, 2006, pp. 047202-1-047202-4, vol. 96, Issue 4, DOI: 10.1103/PhysRevLett.96.047202, American Physical Society.

(Continued)

*Primary Examiner* — Matthew L Reames
(74) *Attorney, Agent, or Firm* — Michael Best & Friedrich LLP

(57) ABSTRACT

The invention provides a spin qubit-type semiconductor device capable of achieving both high-speed spin manipulation and high integration, and an integrated circuit for the spin qubit-type semiconductor device. The spin qubit-type semiconductor device includes a body comprised of at least one of a semiconductor layer itself formed with a quantum dot and a structural portion arranged around the semiconductor layer, a gate electrode arranged at a position on the semiconductor layer, which faces the quantum dot, at least one micro magnet wholly or partly embedded in the body so that a first position condition in which the micro magnet is at a position near the quantum dot, a second position condition in which the position of a lower end of the micro magnet is located below the gate electrode, and a third position condition in which when viewed from above the body, the micro magnet is arranged at a position having no rotational symmetry with the quantum dot as the center of rotation are satisfied, and a static magnetic field applying unit capable of applying a static magnetic field to the quantum dot and the micro magnet.

8 Claims, 55 Drawing Sheets

(56) References Cited

OTHER PUBLICATIONS

M. Pioro-Ladriere et al., "Electrically driven single-electron spin resonance in a slanting Zeeman field", Nature Physics 4, Published online Aug. 17, 2008, www.nature.com/articles/nphys1053, pp. 776-779, vol. 4, DOI: 10.48550/arXiv.0805.1083, Macmillan Publishers Limited.

Jun Yoneda et al., "Robust micromagnet design for fast electrical manipulations of single spins in quantum dots", Applied Physics Express 8, Published Jul. 7, 2015, pp. 084401-1-084401-4, vol. 8, No. 8, DOI: 10.7567/APEX.8.084401, the Japan Society of Applied Physics.

G. Simion et al., "A Scalable One Dimensional Silicon Qubit Array with Nanomagnets", Published in 2020 IEEE International Electron Devices Meeting (IEDM), Date of Conference Dec. 12-18, 2020, pp. 30.2.1-30.2.4, DOI: 10.1109/IEDM13553.2020.9372067, IEEE.

"Technical Highlights from the 2021 Symposia on VLSI Technology & Circuits", Virtual conference from Jun. 13-19, 2021, www.imec-int.com/en/events/2021-symposia-vlsi-technology-and-circuits, imec.

Shota Iizuka et al., "Buried Nanomagnet Realizing High-Speed/Low-Variability Silicon Spin Qubits: Implementable in Error-Correctable Large-Scale Quantum Computers", Published in 2021 Symposium on VLSI Circuits, Date of Conference: Jun. 13-19, 2021, 13 sheets, DOI: 10.23919/VLSICircuits52068.2021.9492449, IEEE.

\* cited by examiner

SPIN QUBIT-TYPE SEMICONDUCTOR DEVICE AND INTEGRATED CIRCUIT THEREOF

BACKGROUND OF THE INVENTION

1. Field of the Invention

The present invention relates to a spin qubit-type semiconductor device which operates the spin of electrons in a quantum dot by a slanting magnetic field applied from a micro magnet, and an integrated circuit thereof.

2. Description of the Related Art

Quantum computers are attracting attention as computers capable of realizing computational performance that surpasses the current computers.

Further, among the basic elements that make up the quantum computer, the spin qubit has a long coherence time (a time during which two quantumly superimposed states continue to interfere) which serves as an index of the time at which information can be held, and can execute quantum operation many times. Therefore, it is attracting particular attention as a practicable quantum bit. In addition, the spin qubit has the advantage that it can be highly integrated as a semiconductor type qubit by miniaturization using a conventional semiconductor integration technology, and that it can operate at high temperatures.

While transistors used in current computers operate by on/off operation of an electric current, the spin qubit operates with the spin up and down of electrons confined in quantum dots as information carriers.

In the conventional spin qubit, an alternating magnetic field by a microwave or like is applied to the quantum dot in which a quantum two-level system consisting of up-spin and down-spin energy levels is formed by application of a static magnetic field, so that electron spin manipulation is performed.

However, a problem arises in that since the spin manipulation by the alternating magnetic field needs to be performed for each element, crosstalk is likely to occur between the integrated individual elements. Therefore, it is required to perform the spin manipulation by an electrical signal.

When the spin manipulation is performed by the electrical signal, it is necessary to convert the electrical signal into a magnetic signal which influences the spin of the electrons. As its conversion method, a method using the interaction inherent in the material such as the spin-orbit interaction, the hyperfine interaction or the like can be assumed. However, these are not suitable for high-speed spin manipulation necessary to realize a large number of quantum operations within a certain period of time because the interaction is weak and the operating speed is slow as a result.

For this reason, there has been proposed a spin manipulation method based on electric dipole spin resonance (EDSR) using a slanting magnetic field generated by micro magnets (refer to Non-Patent Document 1).

It has now been demonstrated that spin manipulation by this method can be performed experimentally (refer to Non-Patent Document 2), and research on the arrangement and size of the micro magnets used for spin manipulation, etc. has also been reported (refer to Non-Patent Documents 3 and 4).

FIG. 1 shows a basic device structure common to these spin qubits utilizing the conventional electric dipole spin resonance.

As shown in FIG. 1, a spin qubit 100 includes a body 103 having a semiconductor region in which a quantum dot (QD) 102 is formed, a gate electrode 105 arranged at a position on the body 103 facing the quantum dot 102 via a gate insulating layer 104, a magnet 106 arranged above the quantum dot 102, and a static magnetic field applying unit (not shown) which applies a static magnetic field $B_0$ to the quantum dot 102.

In the spin qubit 100, the electrons in the quantum dot 102 form a quantum two-level system composed of up-spin and down-spin energy levels in response to the application of the static magnetic field $B_0$. Further, the magnet 106 is magnetized by the static magnetic field $B_0$ to form a magnetic field B. This magnetic field B forms a slanting magnetic field $B_{SL}$ whose magnetic field strength varies spatially at the position of the quantum dot 102. That is, the $B_X$ component of the magnetic field B (the component in the right direction in FIG. 1) changes in strength according to the position in the height direction (the vertical direction in FIG. 1) of the body 103, and the slanting magnetic field $B_{SL}$ is formed (refer to an explanatory view on the lower side of FIG. 1) by the gradient of its strength change. In this state, when an alternating voltage is applied to the gate electrode 105, the center of gravity of electrons in the quantum dot 102 vibrates in the slanting magnetic field $B_{SL}$, and the electrons make transition between two levels in the quantum two-level system. That is, the electron spin manipulation is realized by an electric signal through the gate electrode 105.

However, the spin qubit 100 involves the following problems.

Arithmetic operations in the quantum computer must be executed many times in a limited coherence time, and speeding up is required for the spin manipulation. The speed of transition between the two levels in the spin manipulation depends on the magnetic field strength of the slanting magnetic field $B_{SL}$, and on the other hand, in the spin qubit 100, the magnet 106 is arranged at a position separated by several hundred nm or more from the quantum dot 102 above the body 103 via the gate electrode 105 (the electrode thickness of 100 nm or more). Therefore, it is not possible to obtain a slanting magnetic field strength sufficient to perform high-speed spin manipulation. Further, in order to apply a strong slanting magnetic field to the quantum dots 102 from the distant position, when the one side of the magnet 106 is assumed to be of sufficient size to exceed several hundred nanometers, the formation area of each spin qubit 100 increases, thus causing an obstacle to high integration in an integrated circuit. Further, when the magnet 106 is set to such a size, the magnet 106 interferes with various wirings necessary for the operation of the spin qubit 100, so that the area for securing wiring space is also required. Thus, it further becomes an obstacle to high integration in the integrated circuit.

PRIOR ART DOCUMENTS

Non-Patent Documents

Non-Patent Document 1: Y. Tokura et al., Physical Review Letters 96, 047202 (2006)

Non-Patent Document 2: M. P.-Ladriere et al., Nature Physics 4, 776 (2008)

Non-Patent Document 3: J. Yoneda et al, Applied Physics Express 8, 084401 (2015).

Non-Patent Document 4: G. Simion, IEDM2020, 30.2, p. 657 (2020)

SUMMARY OF THE INVENTION

An object of the present invention is to solve the above-mentioned conventional various problems and to achieve the following issues. That is, it is an object of the present invention to provide a spin qubit-type semiconductor device capable of achieving both high-speed spin manipulation and high integration, and an integrated circuit thereof.

Means for Solving the Above Problems are as Follows

<1> A spin qubit-type semiconductor device includes a body comprised of at least one of a semiconductor layer itself formed with a quantum dot and a structural portion arranged around the semiconductor layer, a gate electrode arranged at a position on the semiconductor layer, which faces the quantum dot, at least one micro magnet wholly or partly embedded in the body so that a first position condition in which the micro magnet is at a position near the quantum dot, a second position condition in which when viewing up and down of the micro magnet with a surface of the semiconductor layer on the side closer to the gate electrode being taken as an upper surface and a surface facing the upper surface being taken as a lower surface, the position of a lower end of the micro magnet is located below the gate electrode, and a third position condition in which when viewed from above the body, the micro magnet is arranged at a position having no rotational symmetry with the quantum dot as the center of rotation are satisfied, and a static magnetic field applying unit capable of applying a static magnetic field to the quantum dot and the micro magnet.

<2> The spin qubit-type semiconductor device described in the above <1>, in which the position of an upper end of the micro magnet is below the gate electrode.

<3> The spin qubit-type semiconductor device described in the above <2> in which at least an upper end portion of the micro magnet on the side near the quantum dot is shaped to have an L-shaped corner in a vertical cross section.

<4> The spin qubit-type semiconductor device described in the above <3>, in which the position of the corner is 5 nm to 25 nm below the upper surface of the semiconductor layer.

<5> The spin qubit-type semiconductor device described in the above <3> or <4>, in which the micro magnet is formed as a quadrangular prism erected along the vertical direction, the maximum diameter of an upper surface of the micro magnet is set to 10 m or less, and the area of the top surface is set to 100 m² or less.

<6> The spin qubit-type semiconductor device described in any one of the above <1> to <5>, in which when the semiconductor layer is viewed from above the body, the semiconductor layer is configured as a cross shape in which two linear layers are crossed in orthogonal directions, and the quantum dot is formed at an intersection point of the cross shape, and in which the micro magnets are arranged at positions facing each other with one of the linear layers interposed therebetween when viewed from above the body.

<7> The spin qubit-type semiconductor device described in any one of the above <1> to <6>, in which a material for forming the micro magnet contains at least any element of iron, cobalt, nickel, and manganese.

<8> An integrated circuit having a plurality of the spin qubit-type semiconductor devices described in any one of the above <1> to <7> which are brought into integration, in which a plurality of quantum dots are formed in one semiconductor layer formed in the same body, and a device structure of the spin qubit-type semiconductor device is formed for each quantum dot.

According to the present invention, it is possible to solve the above various problems in the prior art and provide a spin qubit-type semiconductor device capable of achieving both high-speed spin manipulation and high integration, and an integrated circuit thereof.

BRIEF DESCRIPTION OF THE DRAWINGS

FIG. 17(l) is a sectional view (12) showing a manufacturing process.

DESCRIPTION OF THE EMBODIMENTS (Spin Qubit-Type Semiconductor Device)

A spin qubit-type semiconductor device of the present invention will be described with reference to the accompanying drawings.

Figure 1:
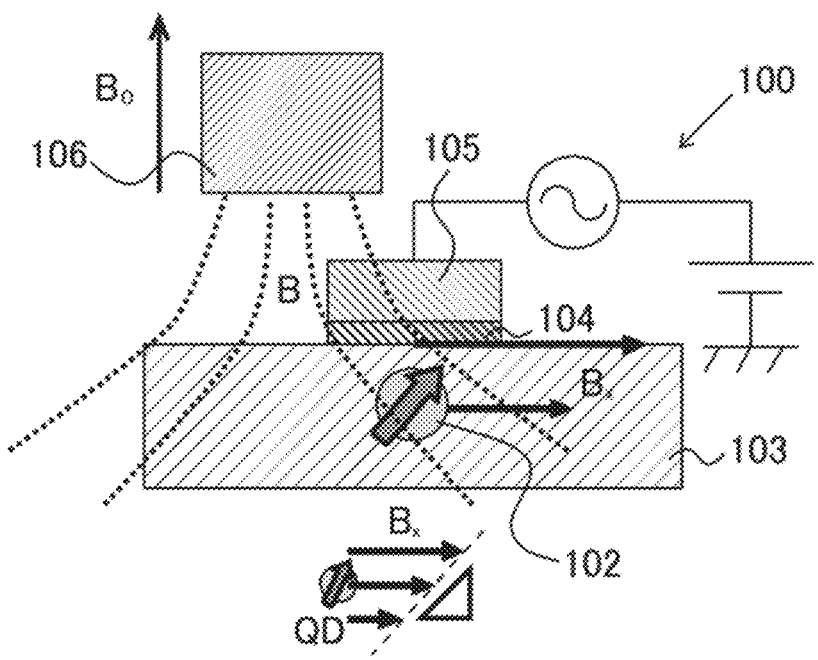
FIG. 1 is an explanatory view for describing a basic device structure common to spin qubits which utilize conventional electric dipole spin resonance.
Figure 2:
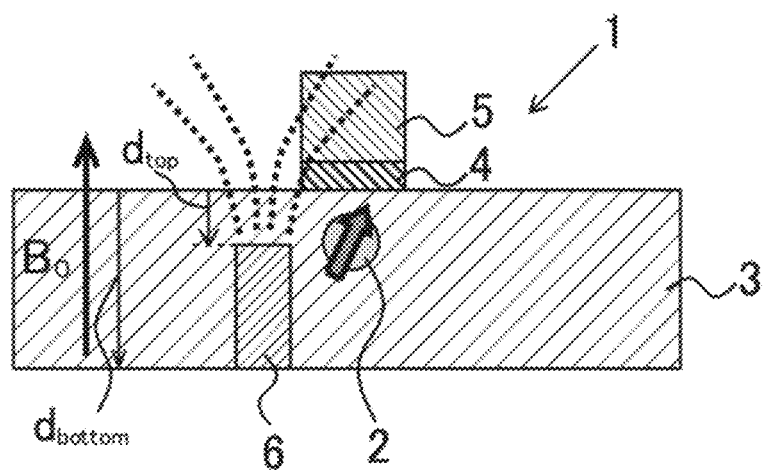
FIG. 2 is an explanatory view for describing a basic device structure of a spin qubit-type semiconductor device according to the present invention.
Figure 3A:
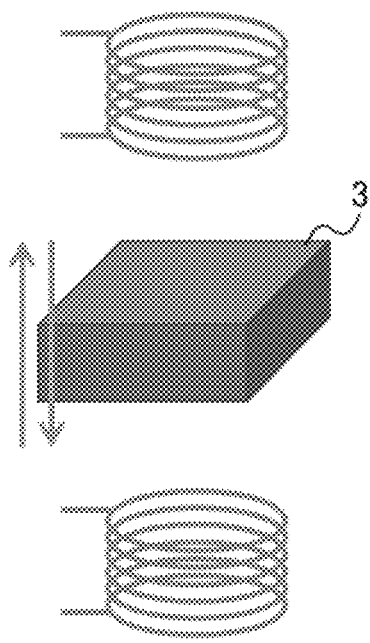
FIG. 3(a) is an explanatory view (1) showing an example of a static magnetic field applying unit.
Figure 3B:
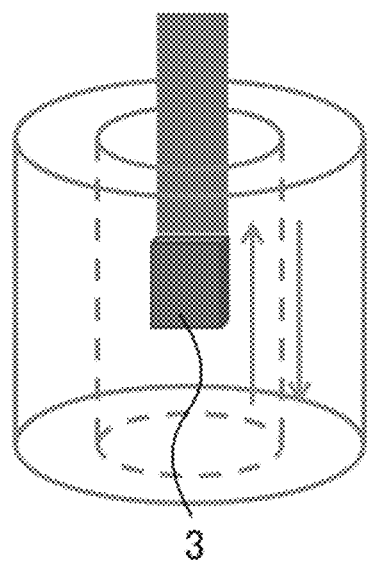
FIG. 3(b) is an explanatory view (2) showing an example of a static magnetic field applying unit.
Figure 3C:
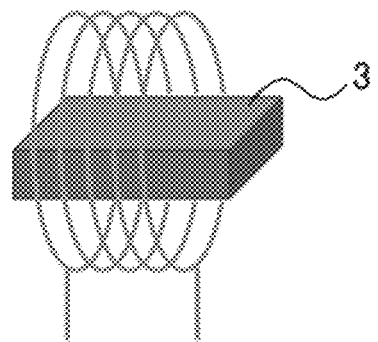
FIG. 3(c) is an explanatory view (3) showing an example of a static magnetic field applying unit.
Figure 3D:
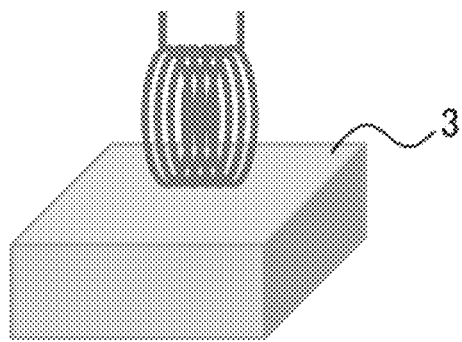
FIG. 3(d) is an explanatory view (4) showing an example of a static magnetic field applying unit.
Figure 3E:
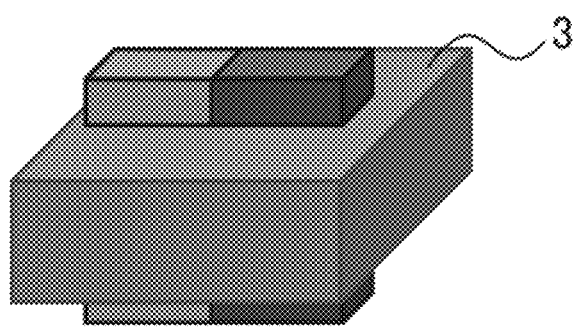
FIG. 3(e) is an explanatory view (5) showing an example of a static magnetic field applying unit.
Figure 3F:
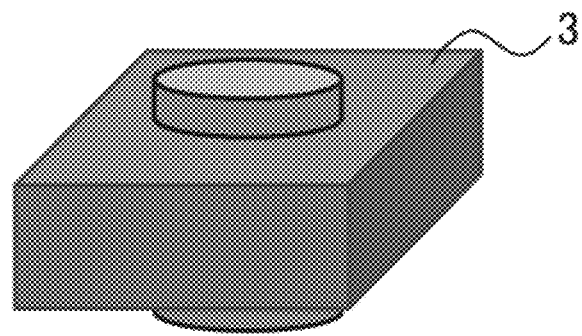
FIG. 3(f) is an explanatory view (6) showing an example of a static magnetic field applying unit.

First, FIG. 2 shows a basic device structure of the spin qubit-type semiconductor device according to the present invention.

As shown in FIG. 2, the spin qubit-type semiconductor device 1 includes a quantum dot 2, a body 3, a gate insulating layer 4, a gate electrode 5, and a micro magnet 6. It also includes a static magnetic field applying unit not shown in the drawing.

In the illustrated example, the body 3 is comprised of a semiconductor layer itself in which the quantum dot 2 is formed. The body 3 may be comprised of any structural portion arranged around the semiconductor layer as described in first to third embodiments to be described later.

The semiconductor layer and the quantum dot 2 are not particularly limited and formed by known materials and forming methods. For example, a known device structure of a single electron transistor is representative.

The gate electrode 5 is arranged at a position facing the quantum dot 2 on the body 3 (the semiconductor layer) via the gate insulating layer 4 interposed therebetween. The gate electrode 5 has a role of controlling the movement of electrons to the quantum dot 2 by applying a voltage, and vibrating the electrons in the quantum dot 2 in a slanting magnetic field formed by the micro magnet 6 by applying an alternating voltage to perform electron spin manipulation.

The gate insulating layer 4 and the gate electrode 5 are also not particularly limited, and may be formed by known materials and forming methods. For example, they may be configured in the same manner as the device structure of the single electron transistor.

In the illustrated example, the micro magnet 6 is entirely embedded in the body 3 and arranged in the vicinity of the quantum dot 2 (a first position condition). The spin manipulation of electrons in the quantum dot 2 can be sped up as the magnetic field strength of the slanting magnetic field formed by the micro magnet 6 increases, and the slanting magnetic field strength increases as the distance from the micro magnet 6 decreases. Therefore, the closer the forming position of the micro magnet 6 is to the quantum dot 2, the better. In the present specification, the term "near position" means that the shortest distance between the quantum dot 2 and the micro magnet 6 is 100 nm or less. This arrangement of the micro magnet 6 close to the quantum dot 2 is made possible by embedding the micro magnet 6 in the body 3.

Further, as for the arrangement of the micro magnet 6 embedded in the body 3 and advantageous for the close arrangement, when viewing up and down with the surface of the body 3 (the semiconductor layer) on the side close to the gate electrode 5 as an upper surface and the surface facing the upper surface as a lower surface, the position of the lower end of the micro magnet 6 is located below the gate electrode 5 (a second position condition). In addition, although not an essential condition of the present invention, as a preferred example, the position of the upper end of the micro magnet 6 is located below the gate electrode 5, and as a further preferred example, the position of the upper end of the micro magnet 6 is located below the upper surface of the body 3 (the semiconductor layer).

These arrangements of the micro magnet 6 are in the order described, so that the space above the gate electrode 5 or the body 3 (the semiconductor layer) can be easily released from the micro magnets 6, and by extension, a structure that makes it easy to secure various wiring spaces for electrode wirings or the like of the gate electrode 5 can be realized.

The shape of the micro magnet 6 is not limited to the illustrated example, and any shape such as a cone, a frustum or the like can be adopted in addition to the shape of a rectangular column, a cylinder, or an elliptical cylinder. Further, these shapes may be partial and any shape combining a plurality of shapes can be adopted.

A suitable shape of the micro magnet 6 may include a shape having L-shaped corners in a vertical cross section. With the corners, a slanting magnetic field with a strong magnetic field strength can be formed in the vicinity of the corners. The corners may be formed at either the upper end or the lower end of the micro magnet 6. Even in either case, from the viewpoint of utilizing the slanting magnetic field near the corners, it is of importance to arrange the micro magnet 6 so that the corners are close to the quantum dot 2.

For example, in the illustrated example, the corners are formed by two each at the upper end (and the lower end) of the micro magnet 6. However, if one corner is formed at the upper end (and the lower end) of the micro magnet 6 and the remainder is U-shaped, the upper end (and lower end) portion on the side closer to the quantum dot 2 is taken as the corner.

When the corner is formed in the micro magnet 6, the corner is preferably positioned 5 nm to 25 nm below the upper surface of the body 3 (the semiconductor layer). That is, in the illustrated example, $d_{top}$ as the shortest distance between the upper end of the micro magnet 6 and the upper surface of the body 3 (the semiconductor layer) is preferably 5 nm to 25 nm. Since the slanting magnetic field formed at the corner becomes strong in magnetic field strength at a position shifted by several nanometers in the vertical direction from the position of the corner, the spin manipulation can be performed at a higher speed by such an arrangement of the micro magnet 6.

Further, when the corner is formed at the upper end of the micro magnet 6 and its forming position is 5 nm to 25 nm below the upper surface of the body 3 (the semiconductor layer), the position of the lower end of the micro magnet 6 is preferably 20 nm to 40 nm or more below the upper surface of the body 3 (the semiconductor layer) while maintaining a thickness of 15 nm in the height direction (vertical direction) of the micro magnet 6 as its minimum thickness. That is, it is preferable that $d_{bottom}$ as the shortest distance between the lower end of the micro magnet 6 and the upper surface of the body 3 (the semiconductor layer) is 20 nm to 40 nm or more.

Setting the size of the micro magnet 6 in the height direction (vertical direction) with the lower end as such a position enables a slanting magnetic field strong in magnetic field strength to be applied to the quantum dot 2. Incidentally, the strength of the slanting magnetic field exerted on the quantum dot 2 tends to be strong as the thickness of the micro magnet 6 in the height direction increases. However, even if the size of the micro magnet 6 is set so that the position of the lower end of the micro magnet 6 exceeds 100 nm and is below the upper surface of the body 3 (the semiconductor layer), there is no large difference in the strength of the slanting magnetic field applied to the quantum dot 2. Therefore, the maximum depth of the lower end position ($d_{bottom}$) of the micro magnet 6 is about 140 nm from the upper surface of the body 3 (the semiconductor layer).

Incidentally, the position of the micro magnet 6 is set with the upper surface of the body 3 (the semiconductor layer) as a reference for the position of the corner because the quantum dot 2 is formed at a position very shallow from the upper surface of the body 3 (the semiconductor layer), that is, a position on the gate electrode 5 side of the body 3 (the semiconductor layer).

Further, when the corner of the micro magnet 6 is formed, it is preferable that the shape thereof is a rectangular column, a cylinder, or an elliptical column erected along the vertical direction from the viewpoint of ease of manufacture by lithography processing. Even among them, a quadrangular prism shape is particularly preferable as a shape that facilitates high integration.

Since the micro magnet 6 can be disposed near the quantum dot 2 by being embedded in the body 3, it is possible to apply a slanting magnetic field with a sufficient strength to the quantum dot 2 in a smaller size than that of the conventional spin qubit 100 (refer to Non-Patent Documents 1 to 4).

From the viewpoint of high integration, the micro magnet 6 preferably has a smaller size as long as a slanting magnetic field with a strength necessary for spin manipulation of electrons in the quantum dot 2 is obtained. In particular, the size of the semiconductor layer in the in-layer direction is of concern for high integration. In the present specification, the term "micro" means that the maximum diameter of the micro magnet 6 in the in-layer direction of the semiconductor layer is 10 m or less.

For example, when the micro magnet 6 is formed as a quadrangular prism erected along the vertical direction (thickness direction of the semiconductor layer), it is preferable that the maximum diameter of the top surface (and bottom surface) thereof is set to 10 m or less, and the area of the top surface (and bottom surface) is set to 100 m² or less.

Incidentally, from the viewpoint of forming a sufficiently strong slanting magnetic field, the lower limits of these maximum diameters are about 3 nm, and the lower limit of the area is about 9 nm².

The material for forming the micro magnet 6 includes known magnetic materials which are magnetized by an external magnetic field applied from the static magnetic field applying unit. Among them, a magnetic material containing at least any element of iron, cobalt, nickel, and manganese is preferable.

Further, a method of forming the micro magnet 6 is not particularly limited, and may include, for example, forming methods by known methods (CVD method, ALD method, CMP method, etc.) using these forming materials.

The static magnetic field applying unit is a unit capable of applying a static magnetic field $B_0$ to the quantum dot 2 and the micro magnet 6. The static magnetic field $B_0$ is made uniform over the entire device forming region and applied in a direction perpendicular to the slanting magnetic field of the micro magnet 6.

The static magnetic field applying unit is not particularly limited, and can be appropriately selected from known members comprised of magnets and coils.

The static magnetic field applying unit does not need to be one for each device, and may be configured to have only one in an integrated circuit. In configurations illustrated in FIGS. 3(*a*) to 3(*f*), one unit may be configured to be arranged for the same body (the body 3).

Incidentally, FIG. 3(*a*) shows a configuration example in which the body 3 is arranged outside a coil, FIG. 3(*b*) shows a configuration example in which the body 3 suspended by a support rod is arranged inside a coil, FIG. 3(*c*) shows a configuration example in which a coil is wound around the body 3, FIG. 3(*d*) shows a configuration example in which a coil is arranged on the body 3, FIG. 3(*e*) shows a configuration example in which a bar magnet is arranged on the body 3, and FIG. 3(*f*) shows a configuration example in which a columnar magnet is arranged on the body 3.

Figure 4:
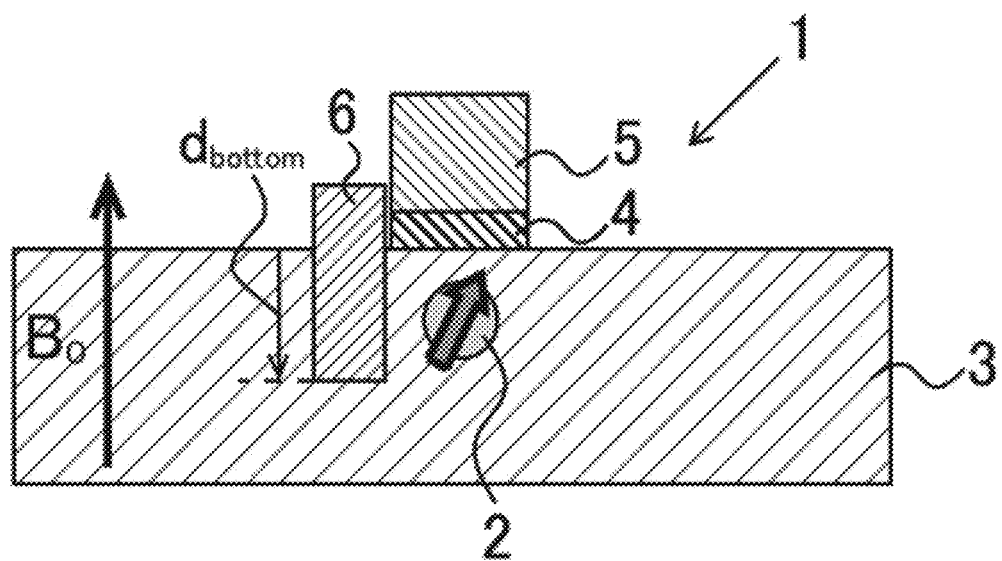
FIG. 4 is an explanatory view related to an example of changing the position of a micro magnet.

Incidentally, in the spin qubit-type semiconductor device 1 shown in FIG. 2, the micro magnet 6 is entirely configured to be embedded in the body 3, but as in a modification shown in FIG. 4, a part of the micro magnet 6 may be configured to be embedded in the body 3.

Also in such a modification, the micro magnet 6 can be arranged at a position near the quantum dot 2.

The micro magnet 6 is arranged at a position having no rotational symmetry with the quantum dot 2 as the center of rotation when viewed from above the body 3 (a third position condition). In the present specification, the term "not having rotational symmetry" means that when the micro magnet 6 is rotated at an arbitrary angle of less than 3600 in a direction parallel to the in-layer direction of the body 3 (the semiconductor layer), the forming positions of the micro magnets 6 do not overlap at any angle.

A configuration example of the body 3 and the micro magnet 6 will be described with reference to top view drawings.

Figure 5A:
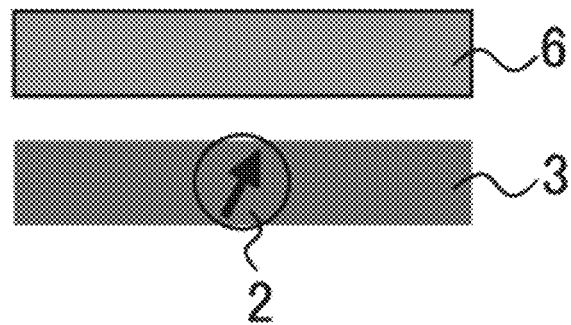
FIG. 5(a) is a top surface explanatory view (1) showing an example of a positional relationship between a quantum dot arranged in a linear semiconductor layer and a micro magnet.
Figure 5B:
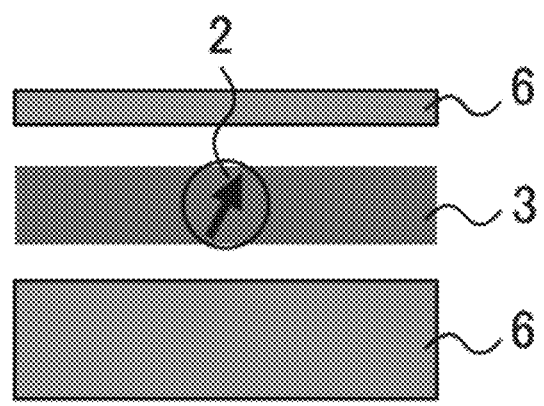
FIG. 5(b) is a top surface explanatory view (2) showing an example of a positional relationship between a quantum dot arranged in a linear semiconductor layer and micro magnets.
Figure 6A:
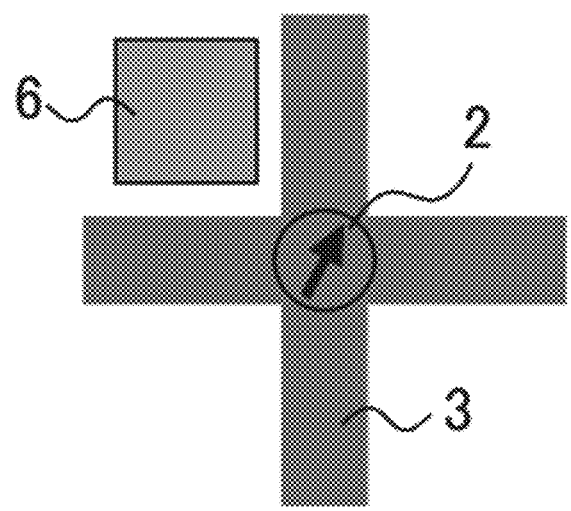
FIG. 6(a) is a top surface explanatory view (1) showing an example of a positional relationship between a quantum dot arranged in a two-dimensional lattice-like semiconductor layer and a micro magnet.
Figure 6B:
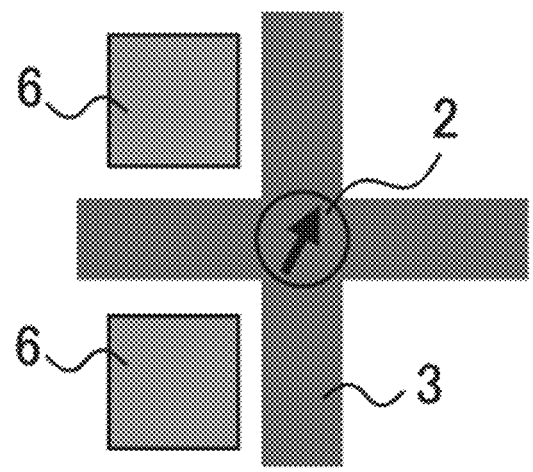
FIG. 6(b) is a top surface explanatory view (2) showing an example of a positional relationship between a quantum dot arranged in a two-dimensional lattice-like semiconductor layer and micro magnets.
Figure 6C:
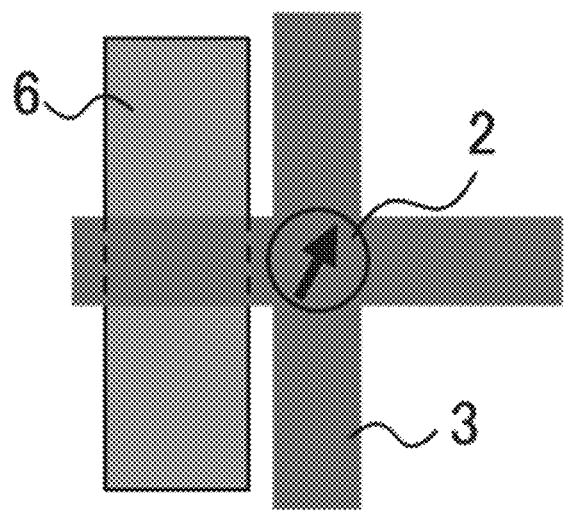
FIG. 6(c) is a top surface explanatory view (3) showing an example of a positional relationship between a quantum dot arranged in a two-dimensional lattice-like semiconductor layer and a micro magnet.
Figure 6D:
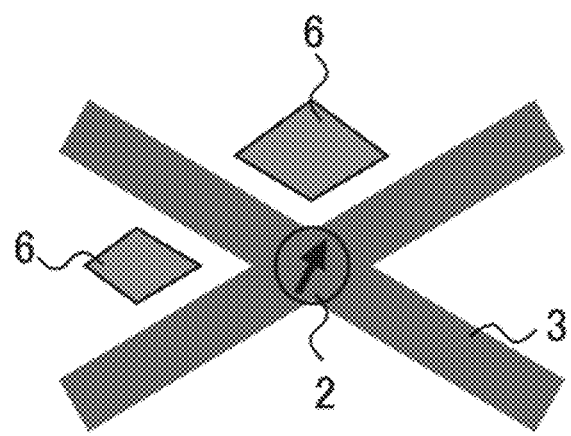
FIG. 6(d) is a top surface explanatory view (4) showing an example of a positional relationship between a quantum dot arranged in a two-dimensional lattice-like semiconductor layer and micro magnets.

First, FIGS. 5(*a*) and 5(*b*) each show an example of the positional relationship between the quantum dot 2 arranged on the linear body 3 (the semiconductor layer) and the micro magnet 6.

Each configuration shown in FIGS. 5(*a*) and 5(*b*) is a one-dimensional configuration example in which the body 3 is comprised of one linear layer (for example, a Fin-type semiconductor layer). When one or two micro magnets 6 are arranged side by side with the linear body 3 (the semiconductor layer) and the micro magnets 6 are arranged on both sides of the body 3, the micro magnets 6 are configured to be different in upper surface shape.

Next, there is shown an example of the positional relationship between the quantum dot 2 arranged in the two-dimensional lattice-like body 3 (the semiconductor layer) and the micro magnet 6.

Each configuration shown in these FIGS. 6(*a*) to 6(*d*) is an example of a two-dimensional lattice-like configuration in which the body 3 is configured by intersecting the two linear layers. One or more micro magnets 6 are arranged at positions each sandwiched between the two linear layers. When arranging two micro magnets 6 having the same top surface shape, the micro magnets 6 are configured to be arranged at positions straddling one linear layer. Further, when the micro magnets 6 are arranged at positions straddling one linear layer, the micro magnets 6 may be arranged at opposing positions with the two micro magnets 6 sandwiching one linear layer. Alternatively, one micro magnet 6 may be arranged so as to be brought under one linear layer.

Figure 7A:
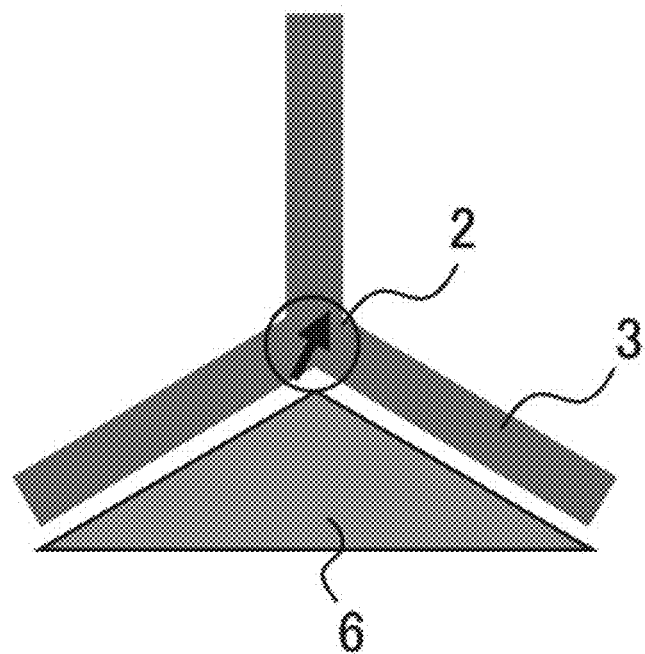
FIG. 7(a) is a top surface explanatory view (1) showing an example of a positional relationship between another quantum dot and a micro magnet.
Figure 7B:
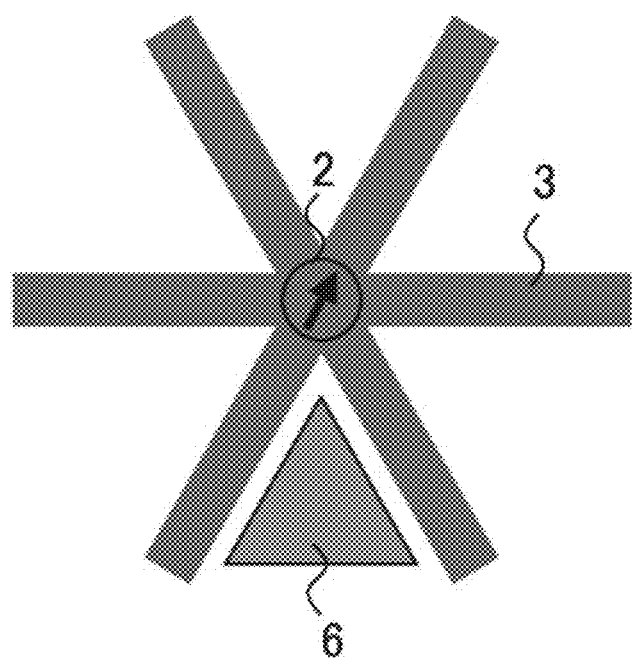
FIG. 7(b) is a top surface explanatory view (2) showing an example of a positional relationship between a further quantum dot and a micro magnet.

Incidentally, in each configuration shown in FIGS. 6(*a*) to 6(*d*), the linear layers are configured such that the four hands extend from the position of the quantum dot 2. However, even in addition to this, as shown in FIGS. 7(*a*) and 7(*b*), the linear layers may be configured such that three or six hands extend from the position of the quantum dot 2. In this case, one or more micro magnets 6 are arranged at positions each sandwiched between the two adjacent linear layers.

When the micro magnet 6 is placed at a position that does not have rotational symmetry with the quantum dot 2 as the center of rotation when viewed from above the body 3, the magnetic field exerted from the micro magnet 6 to the quantum dot 2 is inclined, and hence a slanting magnetic field is exerted onto the quantum dot 2.

First Embodiment

The spin qubit-type semiconductor device of the present invention can take various embodiments based on the basic device structure shown in FIG. 2.

A spin qubit-type semiconductor device 10 according to a first embodiment will be described with reference to FIGS. 8(*a*) and 8(*b*). Incidentally, FIG. 8(*a*) is a perspective view showing an outline of the spin qubit-type semiconductor device 10 according to the first embodiment, and FIG. 8(*b*) is a cross-section illustrating the outline of the spin qubit-type semiconductor device 10 according to the first embodiment.

The spin qubit-type semiconductor device 10 has a quantum dot 12, a substrate 13*a*, a fin-shaped semiconductor layer 13*b*, a gate insulating layer 14, a gate electrode 15, and a micro magnet 16. The spin qubit-type semiconductor device 10 also has the static magnetic field applying unit not shown in the drawing.

In these components, the quantum dot 12, the gate insulating layer 14, the gate electrode 15, the micro magnet 16, and the static magnetic field applying unit are configured in the same manner as the items described for the spin qubit-type semiconductor device 1.

The spin qubit-type semiconductor device 10 is configured according to a FinFET type device structure. Instead of the body 3 of the spin qubit-type semiconductor device 1, the body is comprised of a substrate 13a supporting a semiconductor layer 13b as the structural portion disposed around a fin-shaped semiconductor layer 13b, and the micro magnet 16 is embedded in the substrate 13a.

The substrate 13a is not particularly limited, and a known substrate can be applied thereto. The substrate 13a may include, for example, various substrates each applied to a semiconductor device, a BOX layer ($SiO_2$ layer) in an SOI substrate, etc.

The semiconductor layer 13b is configured as a linear layer formed on the substrate 13a, and is formed of a known semiconductor material, for example, various semiconductor materials applied to semiconductor devices, an Si layer in an SOI substrate, etc.

The operation of the spin qubit-type semiconductor device 10 will be described. Incidentally, the device structure of the spin qubit-type semiconductor device 10 may further include various device structures of semiconductor devices to which known quantum dots are applied. However, here, the description will be made assuming that it has as a representative device structure, a device structure of a general single electron transistor (SET).

Figure 9:
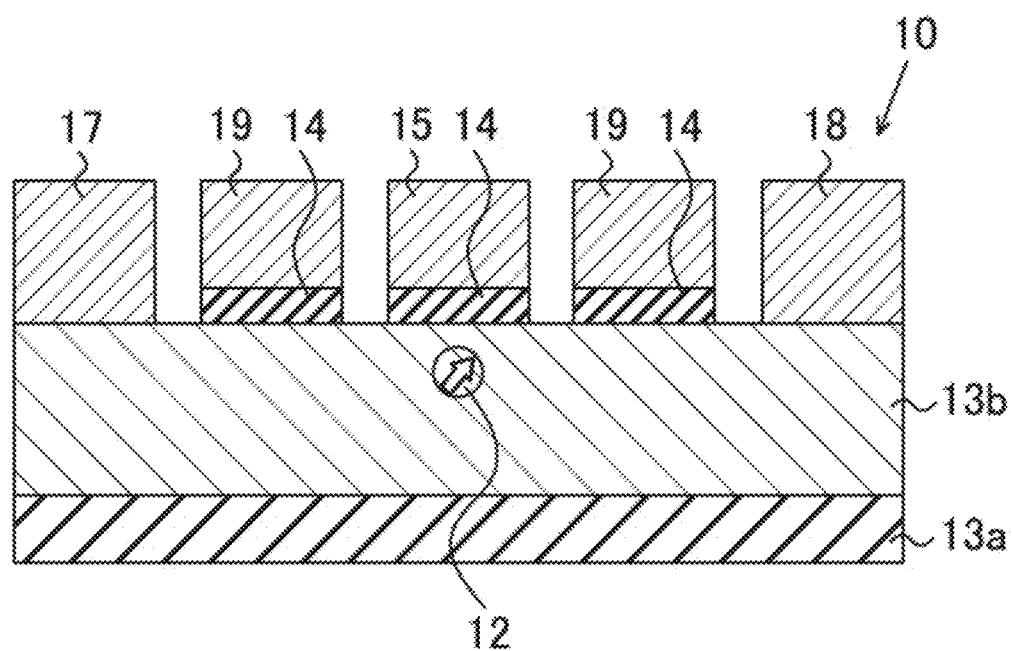
FIG. 9 is an explanatory view (1) for describing the operation of the spin qubit-type semiconductor device according to the first embodiment.

As shown in FIG. 9, in the spin qubit-type semiconductor device 10, two barrier gate electrodes 19 are formed on the semiconductor layer 13b on both sides of the gate electrode 15 via the gate insulating layer 14 so as to sandwich the gate electrode 15 in the in-layer direction of the semiconductor layer 13b.

Further, a source electrode 17 and a drain electrode 18 are arranged at positions on the semiconductor layer 13b with one barrier gate electrode 19 being sandwiched between the gate electrode 15 and the positions in the in-layer direction of the semiconductor layer 13b.

The gate electrode 15 controls the movement of electrons to the quantum dot 12, and the barrier gate electrode 19 controls tunnel coupling between the source on the source electrode 17 side and the drain on the drain electrode 18 side and the quantum dot 12.

In other words, with the operation of the voltages of the gate electrode 15 and the barrier gate electrode 19, the tunnel movement of electrons to the quantum dot 12 can be controlled to form the quantum dot 12 in which only one electron is confined.

Figure 8A:
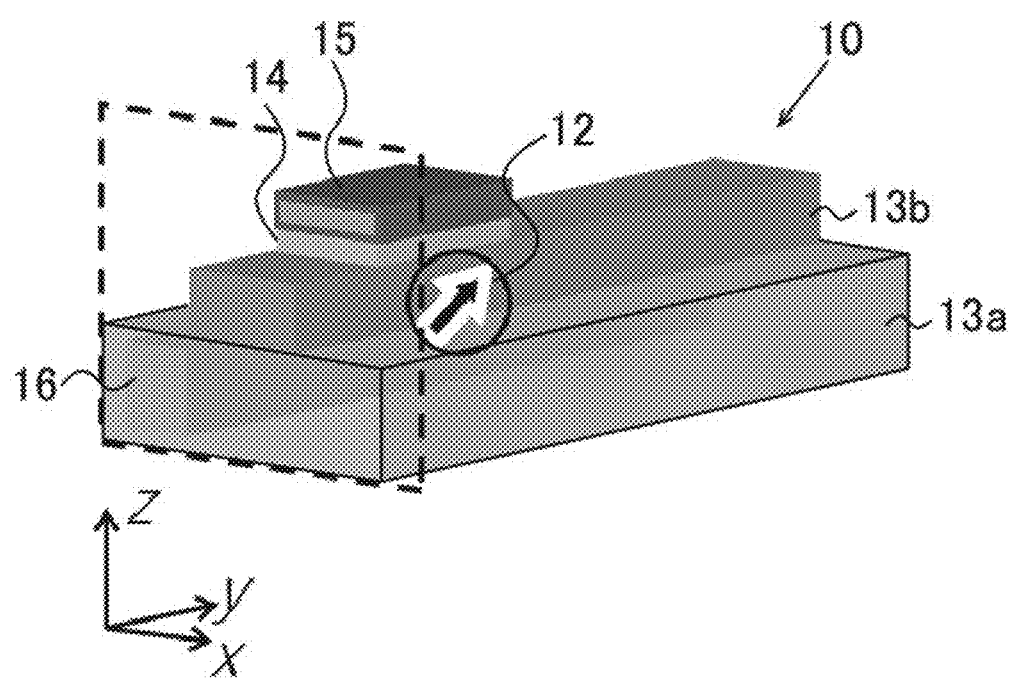
FIG. 8(a) is a perspective view showing an outline of a spin qubit-type semiconductor device according to a first embodiment.
Figure 8B:
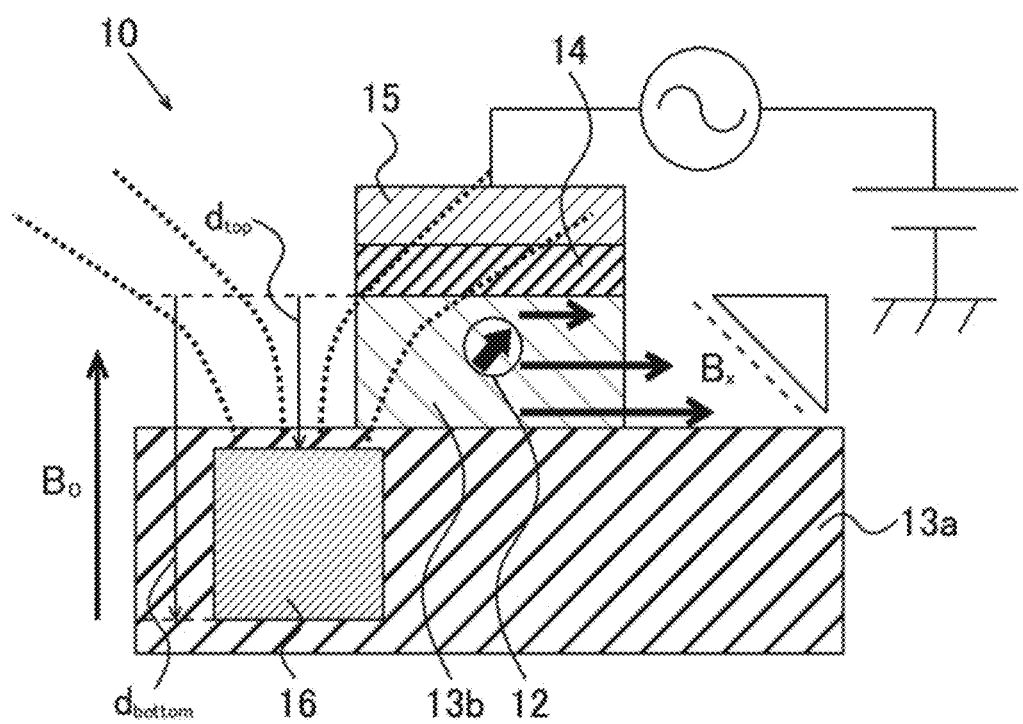
FIG. 8(b) is a sectional view showing the outline of the spin qubit-type semiconductor device according to the first embodiment.

Incidentally, FIG. 9 shows a cross section of the semiconductor layer 13b in its longitudinal direction (a y direction) in FIG. 8(a).

Figure 10:
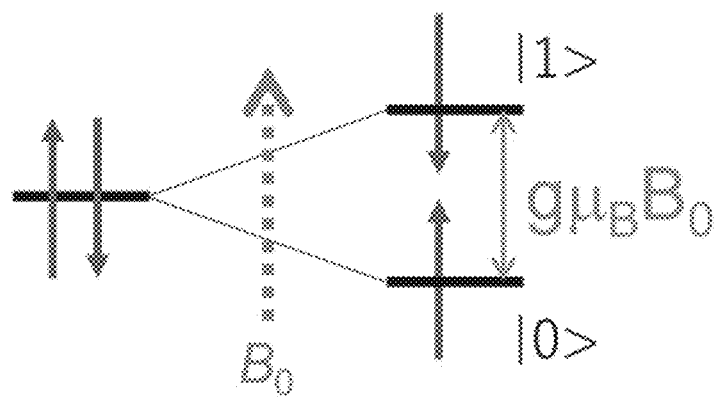
FIG. 10 is a view describing energy levels of electrons in a quantum dot before and after application of a static magnetic field.

When the static magnetic field $B_0$ is applied from the static magnetic field applying unit to the localized level of the electron confined in the quantum dot 12, Zeeman splitting occurs in which the energy level is split due to an energy difference of $g\mu_B B_0$ ($\mu_B$: Bohr magneton, g: g factor of electron spin), and a quantum two-level system represented by two quantum states of |0>state and |1>state is generated in the quantum dot 12 (refer to FIG. 10).

Figure 11:
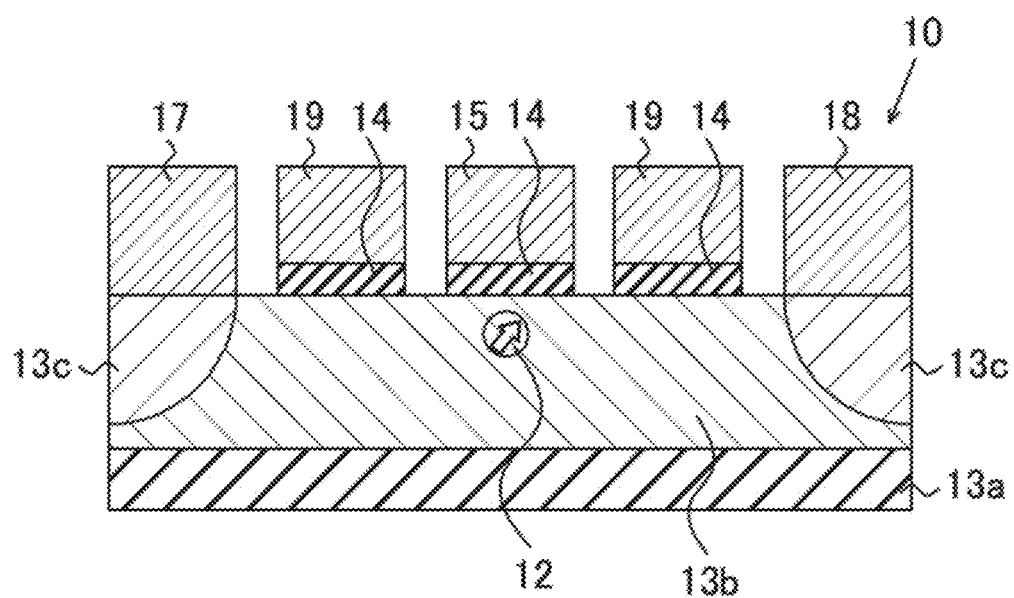
FIG. 11 is an explanatory view (2) for describing the operation of the spin qubit-type semiconductor device according to the first embodiment.

Further, in the spin qubit-type semiconductor device 10, as shown in FIG. 11, the source electrode 17 and the drain electrode 18 are used as reservoir electrodes, and a reservoir 13c is formed which stores electrons in the semiconductor layer 13b by operating the voltages of the reservoir electrodes.

Figure 12A:
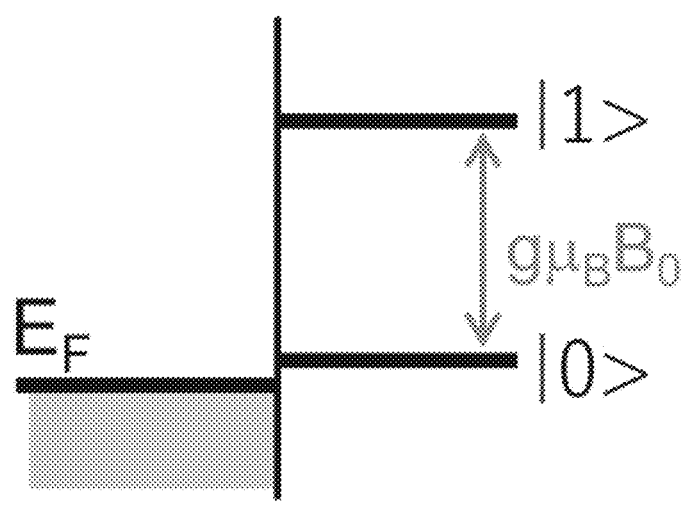
FIG. 12(a) is an explanatory view showing an energy position relationship between a quantum dot in an initial state and a reservoir.
Figure 12B:
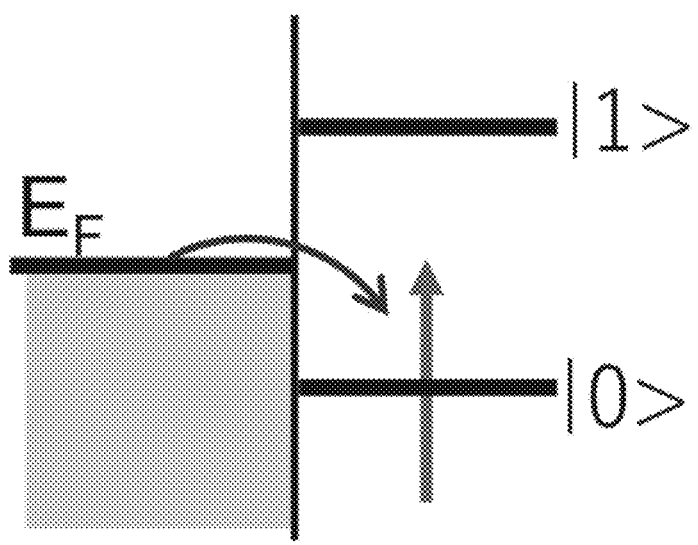
FIG. 12(b) is an explanatory view showing an energy position relationship between the quantum dot and the reservoir after voltage application to a reservoir electrode.

With the voltage operation of the gate electrode 15 and the barrier gate electrode 19, when the voltage operation is performed so that the Fermi level ($E_F$) of the reservoir electrode is fit in the quantum two-level system in a state in which electron tunneling to the quantum dot 12 is permitted, an electron tunnels from the reservoir 13c to the low energy level of the quantum two-level system of the quantum dot 12, thereby forming a state in which one electron exists in the |0>state (refer to FIGS. 12(a), and 12(b)). Initialization is completed by forming the state in which one electron exists in the |0>state.

Referring again to FIG. 8(b), when an alternating voltage is applied to the gate electrode 15 after initialization is completed, the center of gravity of electrons in the quantum dot 12 vibrates in the slanting magnetic field formed by the micro magnet 16, and hence the electrons make transition between the quantum two levels. At this time, in the electrons in the quantum dot 12, the slanting magnetic field formed by the micro magnet 16 and the alternating magnetic field generated by the gate electrode 15 to which the alternating voltage is applied resonate (Rabi resonance), and |0>state and |1>state overlaps, whereby Rabi cycle is generated in which the |0>state and |1>state are repeated while taking an intermediate state between them.

Thus, in the spin qubit-type semiconductor device 10, the |0>state and |1>state of the quantum two-level system and the superposition state (hereinafter simply referred to as a quantum bit) being an intermediate state of these are controlled by controlling an electric signal applied to the gate electrode 15.

A method of reading out the quantum bit in the quantum dot 12 is not particularly limited, and can be appropriately selected from known methods. Here, the gate reflectometry method and the Elzerman method will be described as two representative methods.

Figure 13:
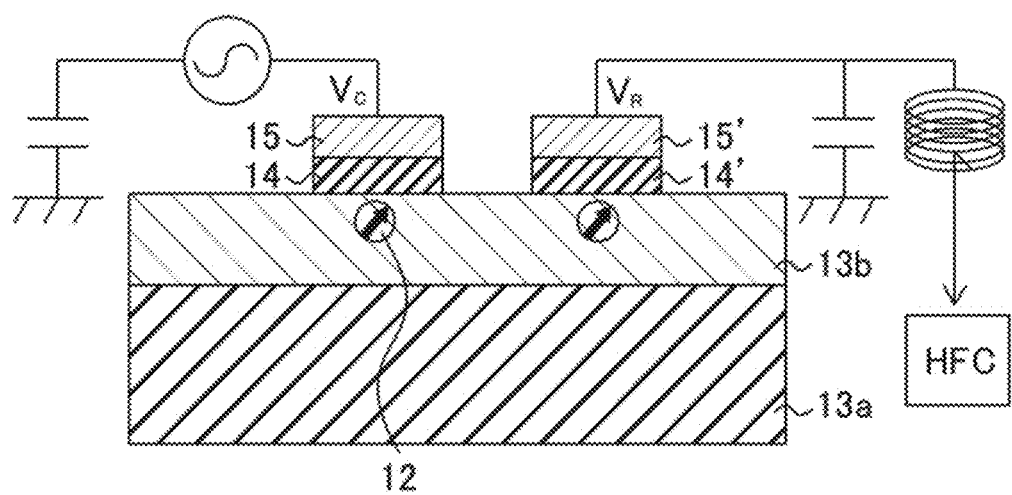
FIG. 13 is an explanatory view for describing a method of reading out a quantum bit state by a gate reflectometry method.

FIG. 13 shows an outline of the spin qubit-type semiconductor device 10 to which a readout configuration based on the gate reflectometry method is added. Incidentally, FIG. 13 illustrates a cross section of the semiconductor layer 13b in its longitudinal direction (a y direction) in FIG. 8(a), and for simplification of the drawing, only the configuration necessary for the readout operation is drawn.

As shown in FIG. 13, in the readout configuration by the gate reflectometry method, a gate insulating layer 14' and a gate electrode 15' are formed in parallel with the device structure of the quantum dot 12 and the gate electrode 15, and a quantum bit for readout is formed beneath these. Further, the gate electrode 15' is connected to a high frequency circuit HFC via a coil.

As a readout method, the operation of coupling the two quantum bits in the quantum dot 12, of the quantum bit and the readout quantum bit, that is, electrically connecting these two quantum bits such that electrons can tunnel through each other between the quantum bit and the readout quantum bit, and adjusting voltages ($V_C$, $V_R$) of the two gate electrodes 15 and 15' is first performed. Then, a high-frequency voltage is input from the high-frequency circuit HFC to the gate electrode 15', and the reflected wave is measured by the high-frequency circuit HFC for its readout.

Figure 14:
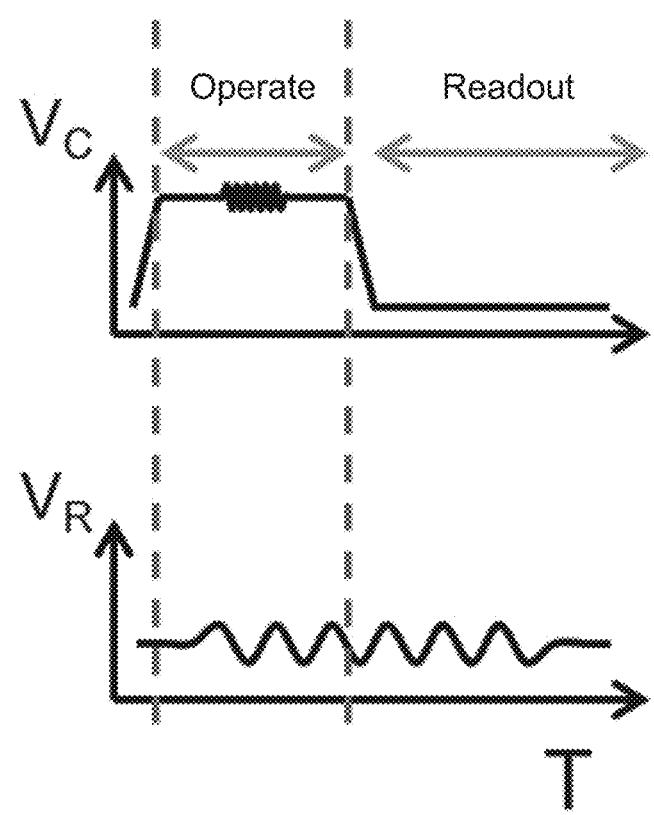
FIG. 14 is an explanatory view for describing a change in voltage with time during operation and during readout.

At this time, according to the quantum state change of the quantum bit on the side of the quantum dot 12, which is illustratively typified by the voltage ($V_C$) change (refer to FIG. 14) of the gate electrode 15 during operation and readout, the phase or amplitude of the reflected wave changes.

This allows the state of the quantum bit to be read out.

Figure 15A:
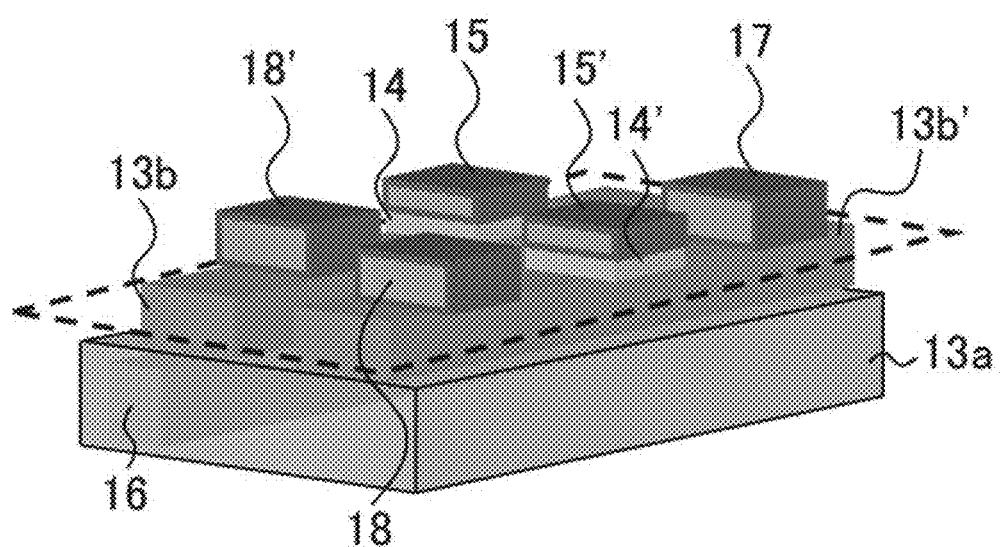
FIG. 15(a) is a perspective view for describing a method of reading out a quantum bit state by the Elzerman method.
Figure 15B:
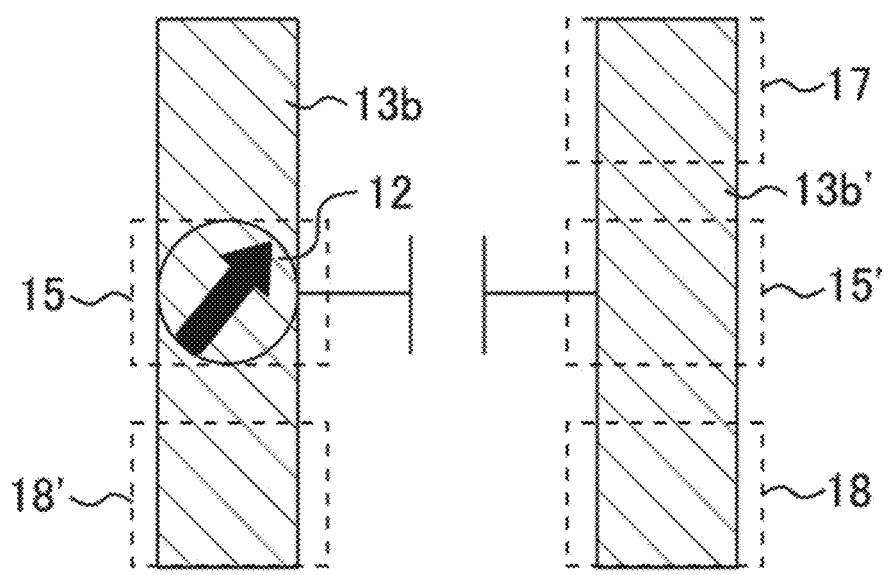
FIG. 15(b) is a sectional view at a position surrounded by a dotted line in FIG. 15(a).

Next, FIGS. 15(a) and 15(b) each show the outline of the spin qubit-type semiconductor device 10 to which a readout configuration based on the Elzerman method is added. Incidentally, FIG. 15(b) shows a cross section of a position enclosed by a dotted line of FIG. 15(a). Also, for simplification of the drawing, only the configuration necessary for the readout operation is drawn.

As shown in these figures, in the readout configuration according to the Elzerman method, the device structure of the single electron transistor (SET) by the fin-shaped semiconductor layer 13b', the gate electrode 15', the source electrode 17, and the drain electrode 18 is arranged side by side with the device structure of the single electron transistor (SET) in which the quantum dot 12 is formed, at a position where the slanting magnetic field from the micro magnet 16 does not reach. These two SETs are capacitively coupled as shown in FIG. 15(b).

In the device structure of the single electron transistor (SET) in which the quantum dot 12 is formed, the energy level of the reservoir 13c is manipulated by a reservoir electrode 18' (the source electrode 17 and the drain electrode 18 in FIG. 9).

Figure 16:
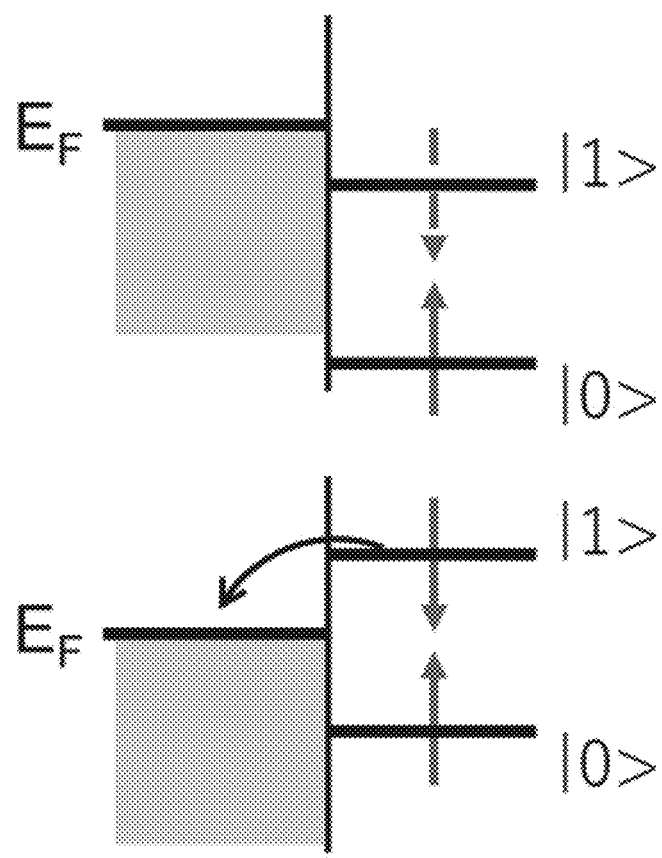
FIG. 16 is an explanatory view for describing a relationship between an energy position during operation and an energy position during readout.

As a readout method, first, the Fermi level ($E_F$) of the reservoir electrode 18' is set higher than the two levels of the quantum bits in the quantum dot 12. In this state, when a voltage is applied to the gate electrode 15 so that the Fermi level of the reservoir electrode is set to be positioned between the two levels of the quantum bits, the tunneling of the electrons from the quantum dot 12 to the reservoir 13c is allowed only when the electrons of the quantum bits are in the |1>state (refer to FIG. 16). Also, a drain current flowing between the source electrode 17 and the drain electrode 18 changes according to a change in the number of electrons in the quantum dot 12 at this time.

This enables the state of the quantum bit to be read out.

Next, an example of a method of manufacturing the spin qubit-type semiconductor device 10 will be described with reference to FIGS. 17(a) to 17(m).

First, a semiconductor substrate having a semiconductor layer 13b formed on a substrate 13a is prepared. Here, an SOI substrate is used as the semiconductor substrate. The substrate 13a is formed of a BOX layer ($SiO_2$), and the semiconductor layer 13b is formed of a Si layer.

Figure 17A:
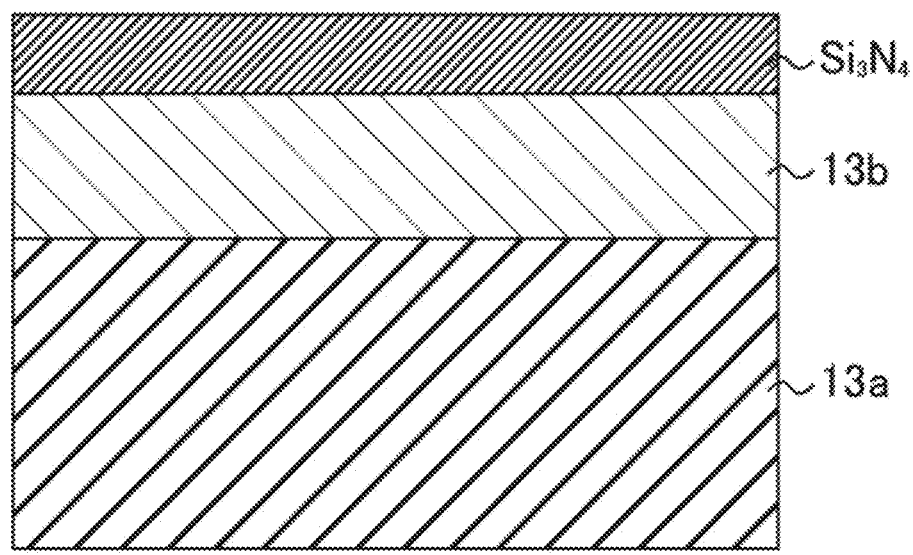
FIG. 17(a) is a sectional view (1) showing a manufacturing process.

Next, a $Si_3N_4$ layer (an insulating material layer) is formed on the semiconductor layer 13b by a known chemical vapor deposition method (CVD method) (refer to FIG. 17(a)).

Figure 17B:
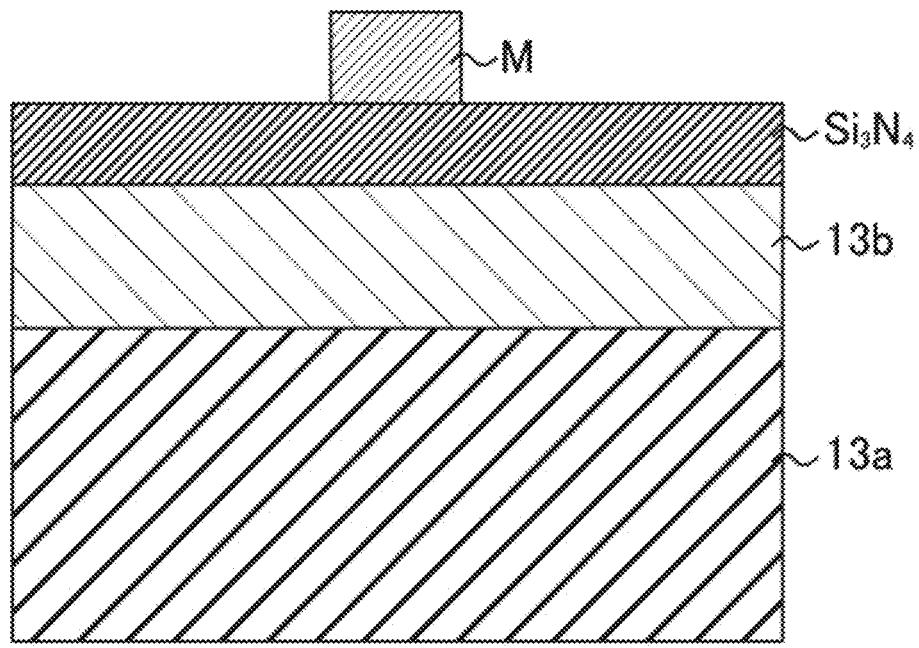
FIG. 17(b) is a sectional view (2) showing a manufacturing process.

Next, an etching mask M is formed on the $Si_3N_4$ layer by a known lithography processing method (refer to FIG. 17(b)).

Figure 17C:
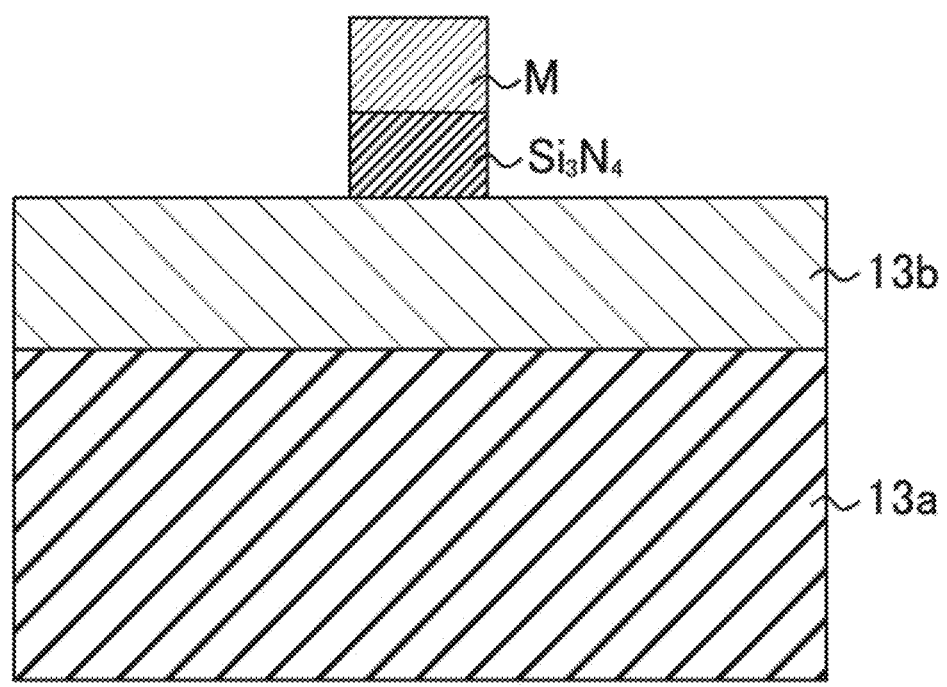
FIG. 17(c) is a sectional view (3) showing a manufacturing process.
Figure 17D:
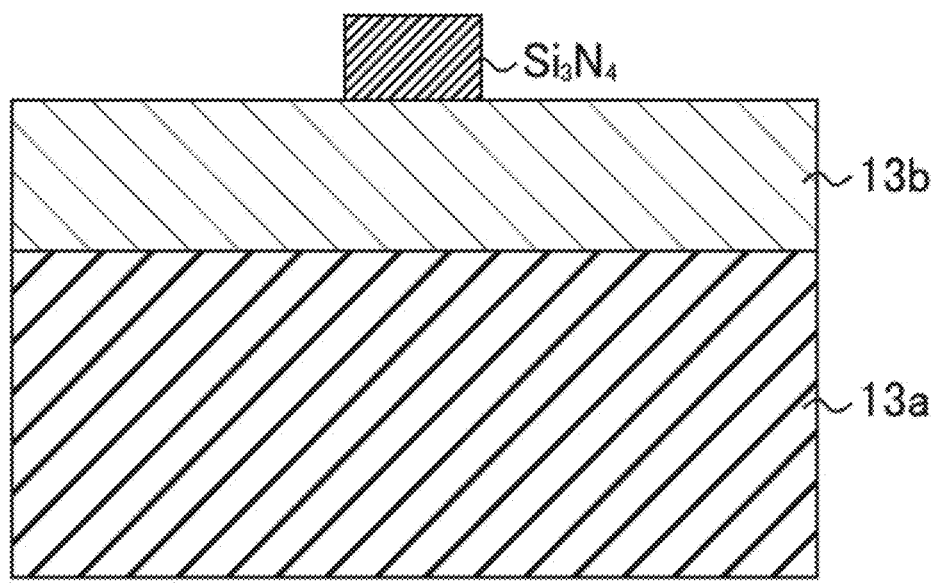
FIG. 17(d) is a sectional view (4) showing a manufacturing process.

Next, etching using $CF_4$ gas is performed by a known reactive ion etching method (RIE method) to anisotropically etch portions of the $Si_3N_4$ layer which are not covered with the etching mask M (refer to FIG. 17(c)). Next, the etching mask M is removed by oxygen ashing treatment (refer to FIG. 17(d)).

Figure 17E:
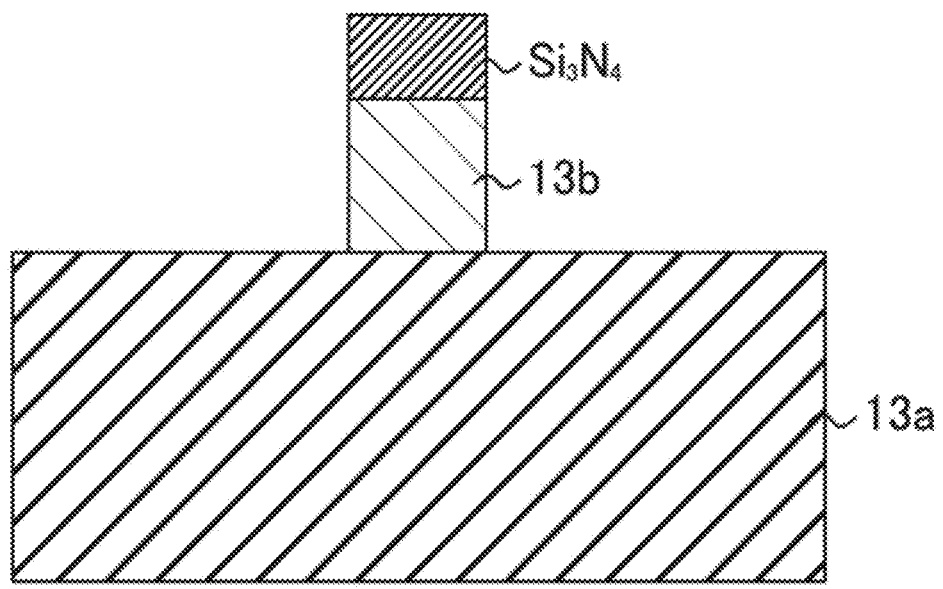
FIG. 17(e) is a sectional view (5) showing a manufacturing process.

Next, the semiconductor layer 13b is subjected to anisotropic etching using HBr gas by the reactive ion etching method to form a fin (refer to FIG. 17(e)).

Figure 17F:
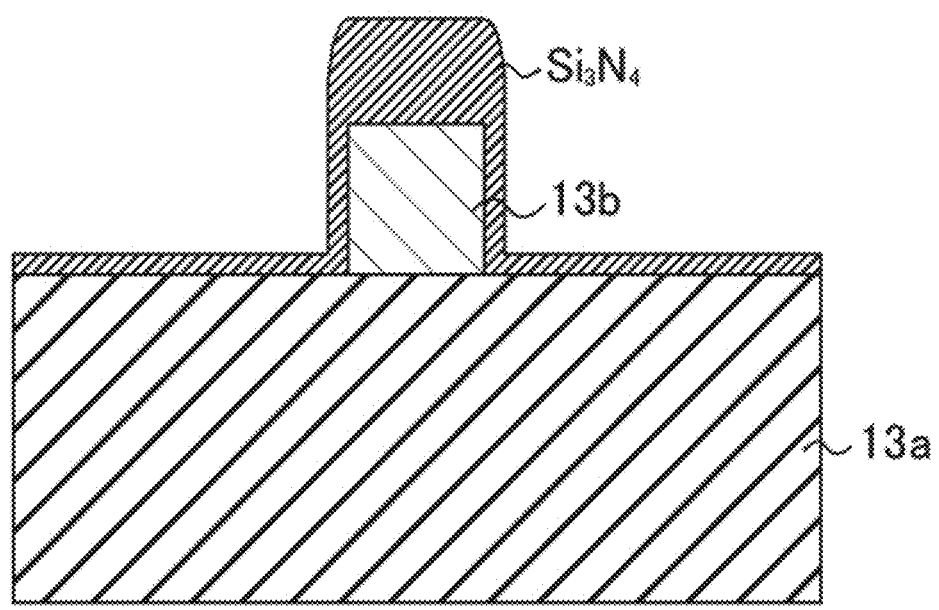
FIG. 17(f) is a sectional view (6) showing a manufacturing process.

Next, $Si_3N_4$ is deposited on the fin by the chemical vapor deposition method or the atomic layer deposition method (ALD method) to cover the upper surface and side surfaces of the fin with $Si_3N_4$ to form sidewalls (refer to FIG. 17(f)).

Figure 17G:
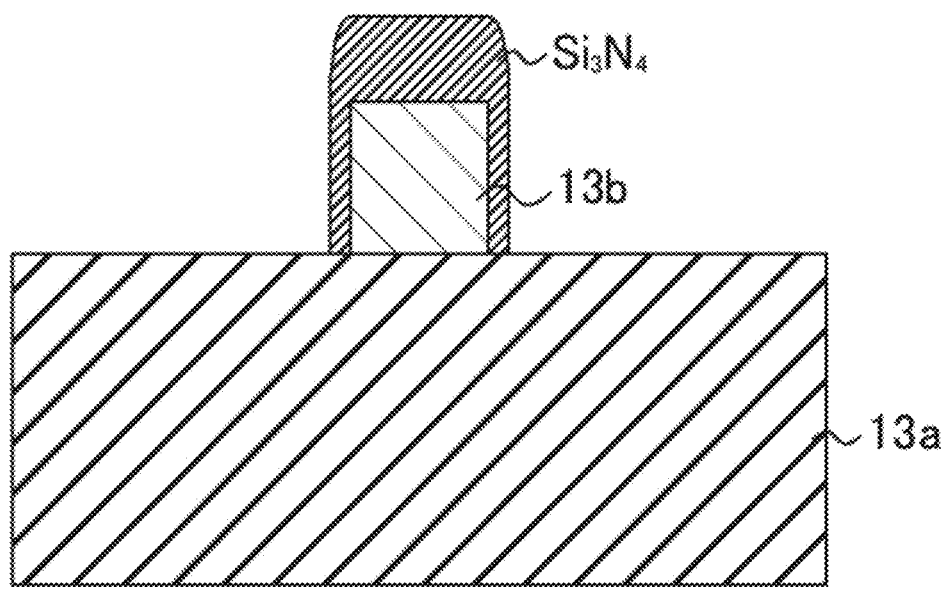
FIG. 17(g) is a sectional view (7) showing a manufacturing process.
Figure 17H:
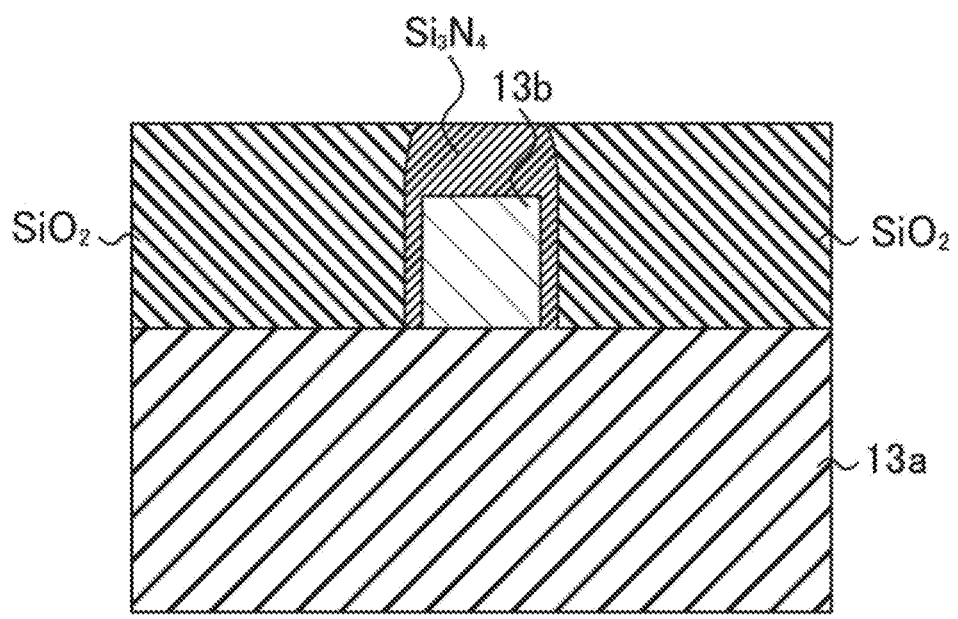
FIG. 17(h) is a sectional view (8) showing a manufacturing process.

Next, anisotropic etching using $CF_4$ plasma is performed to remove $Si_3N_4$ other than the sidewalls (refer to FIG. 17(g)).

Next, a $SiO_2$ layer is formed on the substrate 13a by the chemical vapor deposition method. After deposition, the top surface thereof is flattened by a known chemical mechanical polishing method (CMP method) (refer to FIG. 17(h)).

Figure 17I:
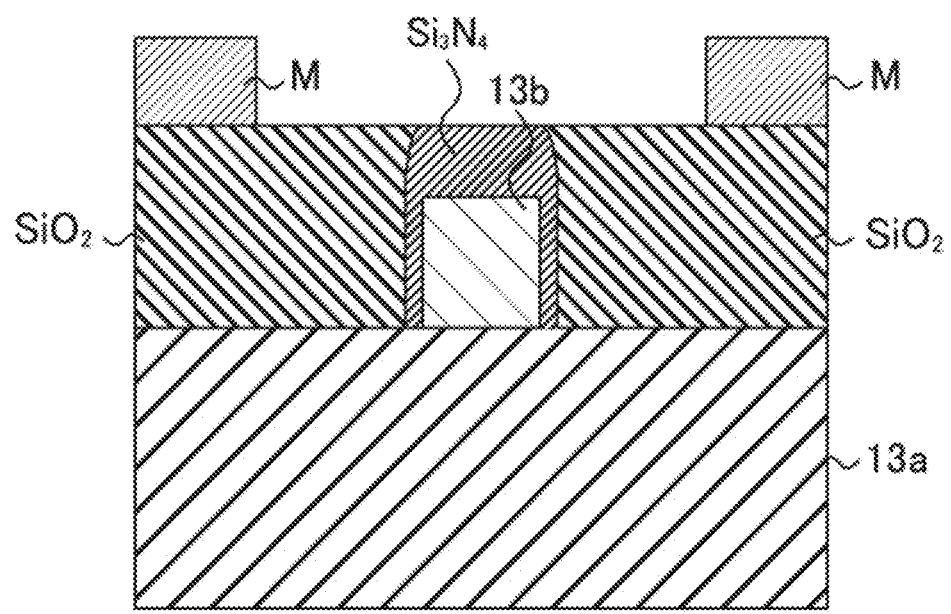
FIG. 17(i) is a sectional view (9) showing a manufacturing process.

Next, an etching mask M is formed on the $SiO_2$ layer by a lithography processing method (refer to FIG. 17(i)).

Figure 17J:
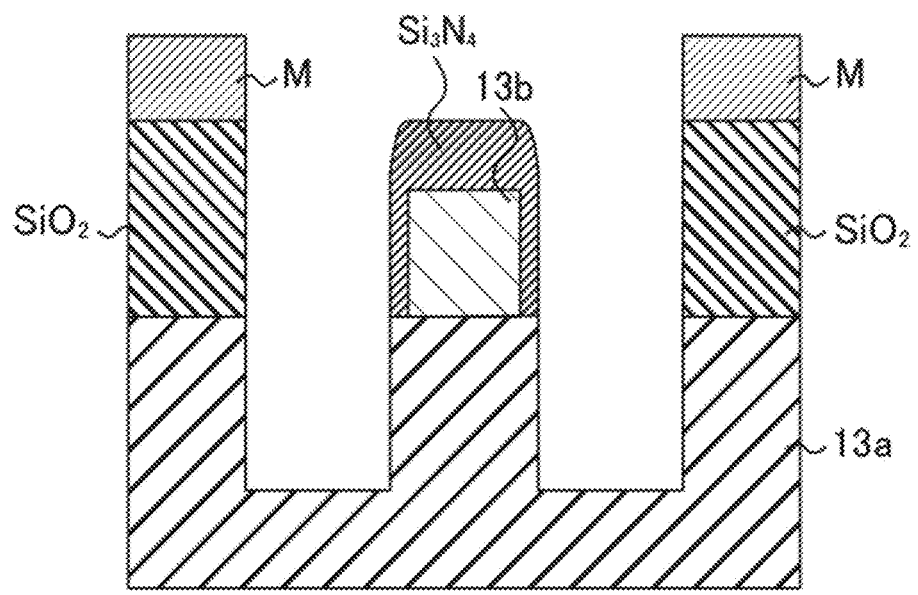
FIG. 17(j) is a sectional view (10) showing a manufacturing process.
Figure 17K:
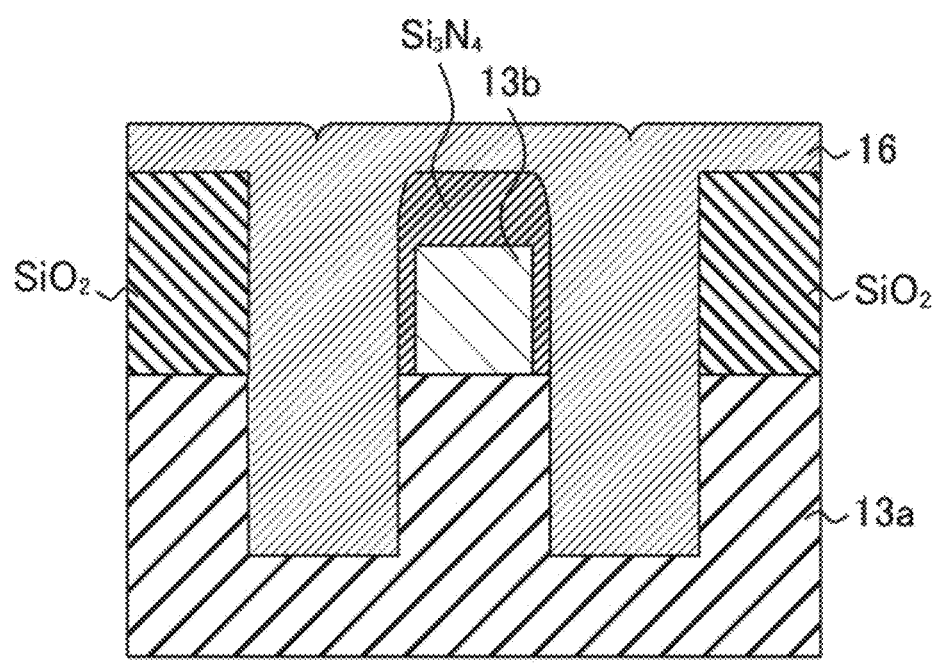
FIG. 17(k) is a sectional view (11) showing a manufacturing process.
Figure 17I:
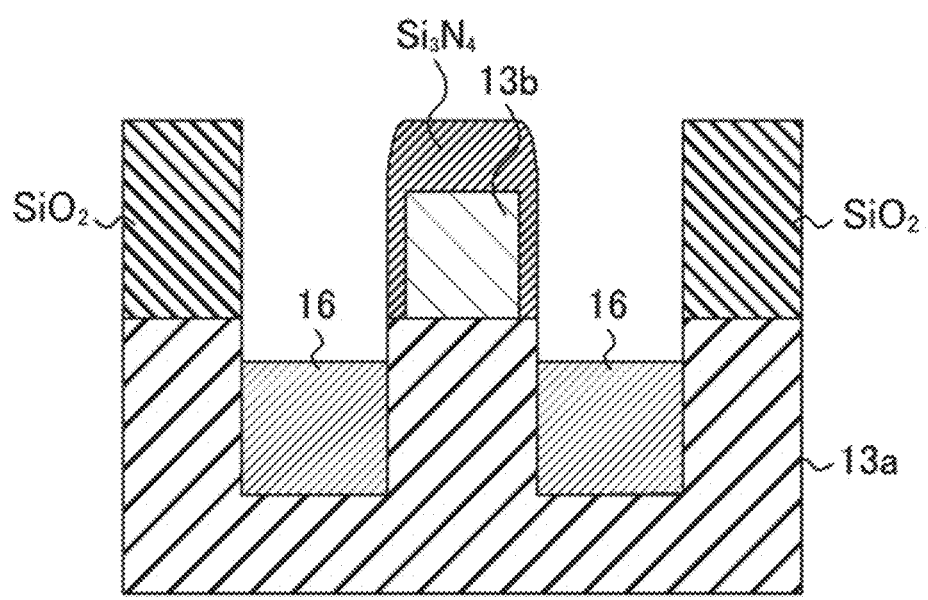

Next, the $SiO_2$ layer and the substrate 13a are anisotropically etched by the reactive ion etching method using $CHF_3$ gas to form trenches for embedding the micro magnets 16 (refer to FIG. 17(j)).

Next, the etching mask M is removed by the oxygen ashing treatment. After that, the material for forming the micro magnets 16 is deposited in the trenches by the chemical vapor deposition method or the atomic layer deposition method (refer to FIG. 17(k)).

Next, molding is performed by the chemical mechanical polishing method, and the micro magnets 16 are arranged at desired positions (see FIG. 17(l)).

Figure 17M:
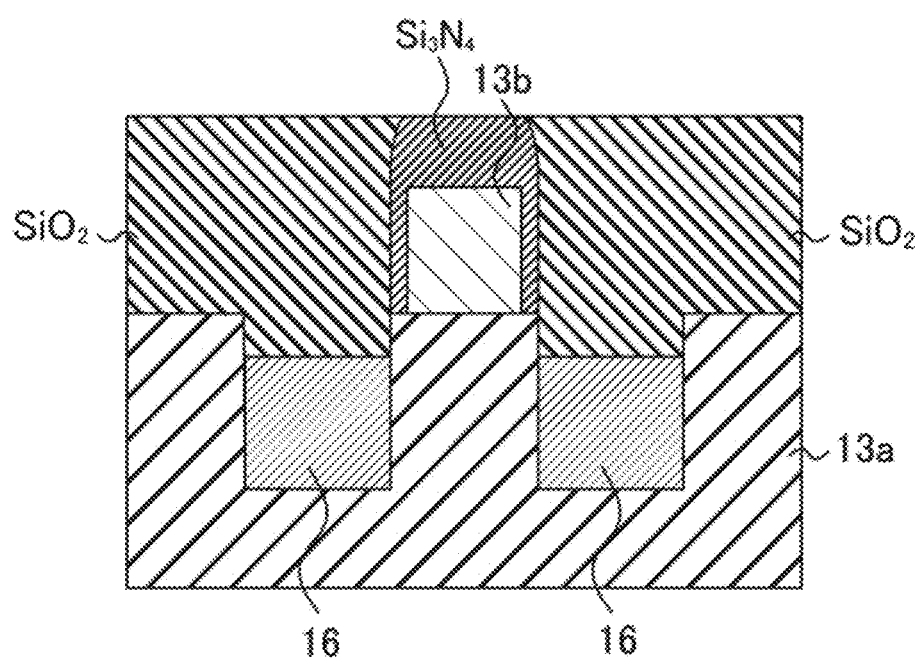
FIG. 17(m) is a sectional view (13) showing a manufacturing process.

Finally, the $SiO_2$ layer is backfilled by the chemical vapor deposition method to obtain a configuration equivalent to the spin qubit-type semiconductor device 10 (FIG. 17(m)).

In the manufacturing method described above, since each part is formed by the known manufacturing method, the existing semiconductor manufacturing equipment can be used, and this can be said to be a practical manufacturing method. In particular, by using the SOI substrate, the existing silicon device manufacturing equipment can be used, which is highly practical.

Further, by forming the trenches for embedding the micro magnets 16 on the basis of the sidewall positions of $Si_3N_4$, the micro magnets 16 can be formed in the vicinity of the quantum dot 12 without causing variation in the forming position.

Incidentally, the manufacturing method described above is an example, and any manufacturing method selected from the known semiconductor device manufacturing methods can be applied.

Second Embodiment

Figure 18:
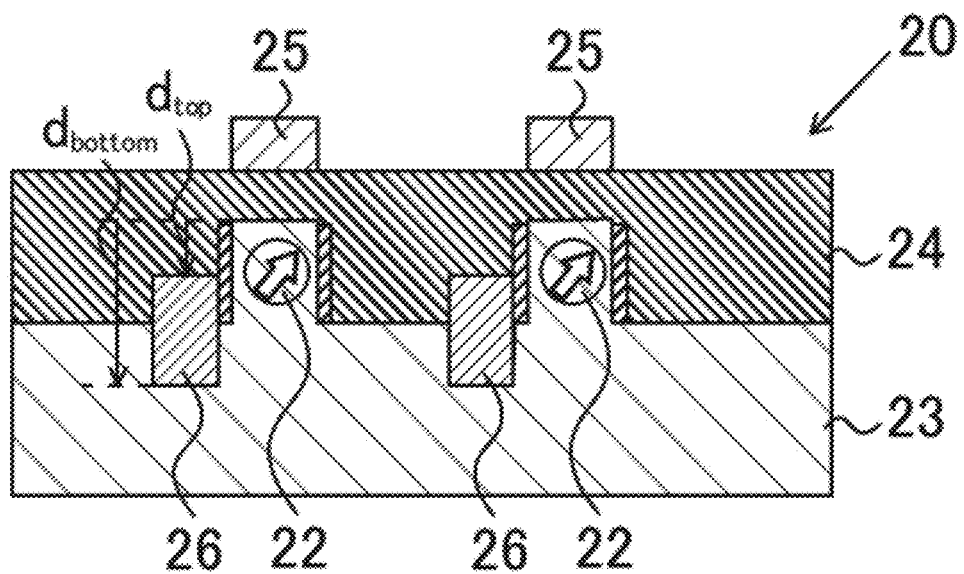
FIG. 18 is a sectional view showing an outline of a spin qubit-type semiconductor device according to a second embodiment.

Next, a spin qubit-type semiconductor device 20 according to a second embodiment will be described with reference to FIG. 18. Incidentally, in the illustrated example, there are shown two equivalent device structures.

The spin qubit-type semiconductor device 20 has quantum dots 22, a semiconductor layer 23, a gate insulating layer 24, gate electrodes 25, and micro magnets 26. The spin qubit-type semiconductor device 20 also has the static magnetic field applying unit not shown in the drawing.

In these components, the quantum dots 22, the gate insulating layer 24, the gate electrodes 25, the micro magnets 26, and the static magnetic field applying unit are configured in the same manner as the items described for the spin qubit-type semiconductor device 10.

In the spin qubit-type semiconductor device 20, instead of the body of the spin qubit-type semiconductor device 10, which is comprised of the substrate 13a, a body comprised of the semiconductor layer 23 having the fin-like shape on the upper surface thereof, and the gate insulating layer 24 as the structural portion arranged around the semiconductor layer 23 is applied, and the quantum dot 22 is formed in the fin-like shape.

Incidentally, in the present example, the micro magnets 26 are embedded in these members so as to straddle the interface between the semiconductor layer 23 and the gate insulating layer 24. As its modified example, the micro magnets 26 may be configured to be embedded only in the semiconductor layer 23 or the gate insulating layer 24. That is, the body can be comprised of the semiconductor layer 23, the gate insulating layer 24, and these members.

Even in the spin qubit-type semiconductor device 20 to which such a configuration is applied, an operation similar to that of the spin qubit-type semiconductor device 10 can be obtained according to the basic structure described with reference to FIG. 2.

Further, the spin qubit-type semiconductor device 20 can be practically manufactured according to the manufacturing method described for the spin qubit-type semiconductor device 10.

Third Embodiment

Figure 19:
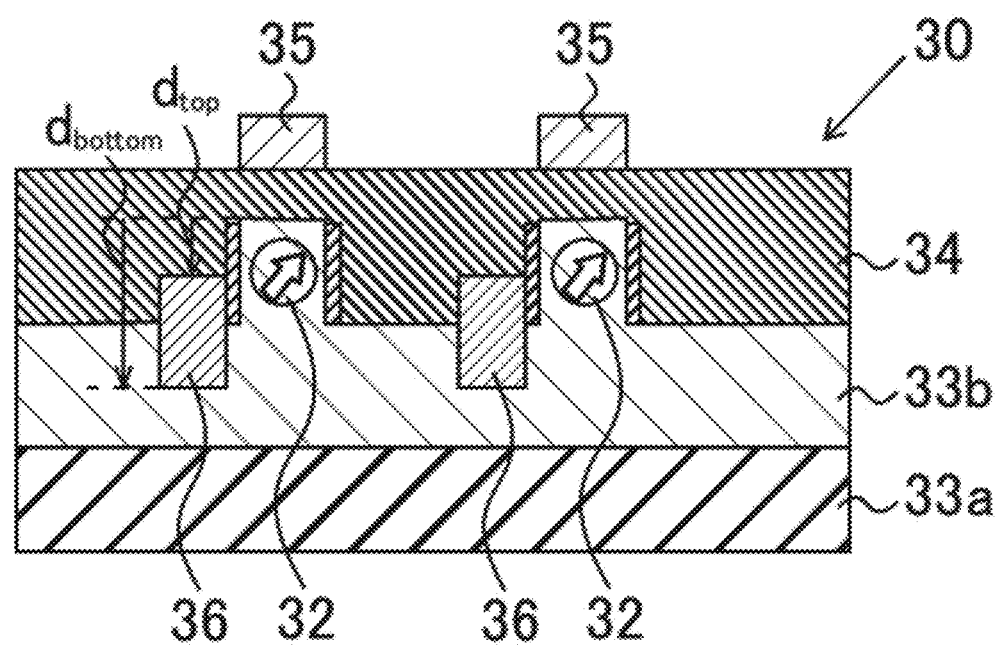
FIG. 19 is a sectional view showing an outline of a spin qubit-type semiconductor device according to a third embodiment.

Next, a spin qubit-type semiconductor device 30 according to a third embodiment will be described with reference to FIG. 19. Incidentally, in the illustrated example, there are shown two equivalent device structures. Further, reference numeral 32 in the drawing indicates a quantum dot, and reference numeral 35 indicates a gate electrode.

In the spin qubit-type semiconductor element 30, instead of the body of the spin qubit-type semiconductor device 20 comprised of the semiconductor layer 23 and the gate insulating layer 24, a body comprised of a semiconductor layer 33*b* and a gate insulating layer 34 is applied. In this body, the semiconductor layer 33*b* corresponding to the semiconductor layer 23 is configured to be supported on a substrate 33*a*.

Incidentally, in the present example, micro magnets 36 are embedded in these members so as to straddle the interface between the semiconductor layer 33*b* and the gate insulating layer 34. As its modified example, the micro magnets 36 may be configured to be embedded only in the semiconductor layer 33*b* or the gate insulating layer 34. Alternatively, the size of each micro magnet 36 may be changed so that it hangs down toward the substrate 33*a*, and the micro magnet 36 may be embedded and configured so as to straddle the respective members of the substrate 33*a*, the semiconductor layer 33*b*, and the gate insulating layer 34. The body may be comprised of the semiconductor layer 33*b*, the gate insulating layer 34, the substrate 33*a*, and these members.

Even in the spin qubit-type semiconductor device 30 to which such a configuration is applied, an operation similar to that of the spin qubit-type semiconductor device 10 can be obtained according to the basic structure described with reference to FIG. 2.

Further, the spin qubit-type semiconductor device 30 can be practically manufactured according to the manufacturing method described for the spin qubit-type semiconductor device 10.

Continuing further, description will be made as to modifications of the spin qubit-type semiconductor devices 10, 20, and 30 with reference to FIGS. 20 to 22.

Figure 20:
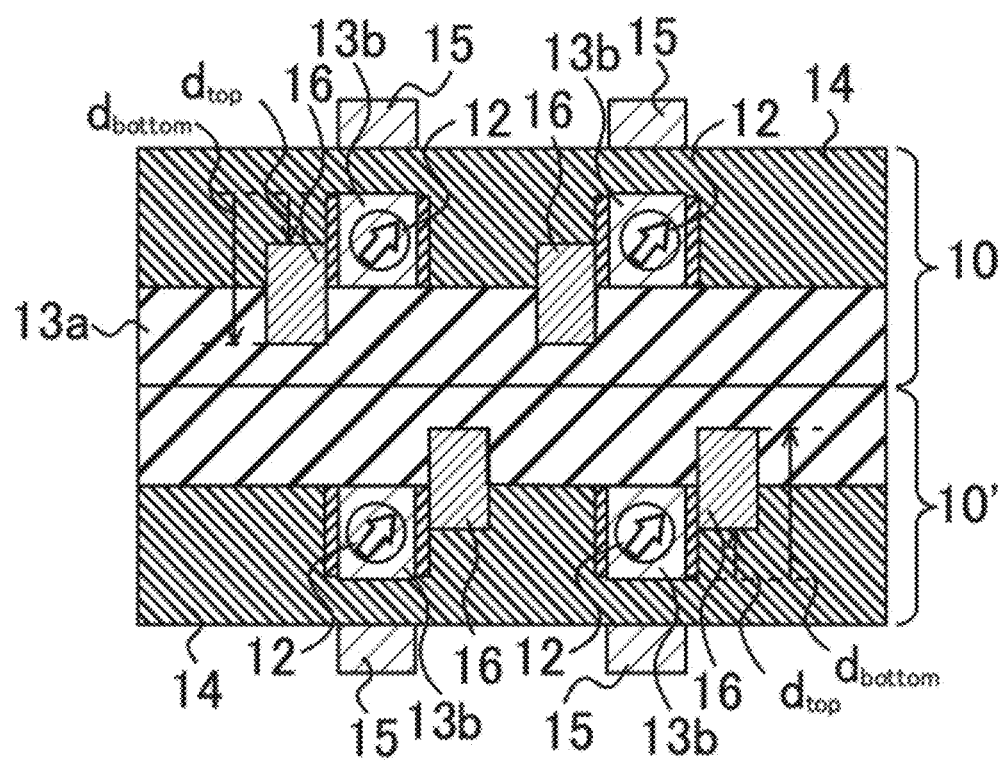
FIG. 20 is a sectional view showing a modification of the spin qubit-type semiconductor device according to the first embodiment.

In the modification shown in FIG. 20, a spin qubit-type semiconductor device 10 and a spin qubit-type semiconductor device 10' equivalent thereto are formed on both the top and bottom surfaces of a substrate 13*a*. Such a double-sided structure may be formed for one substrate 13*a*, or two device structures formed separately may be formed by bonding the substrates 13*a* together.

Figure 21:
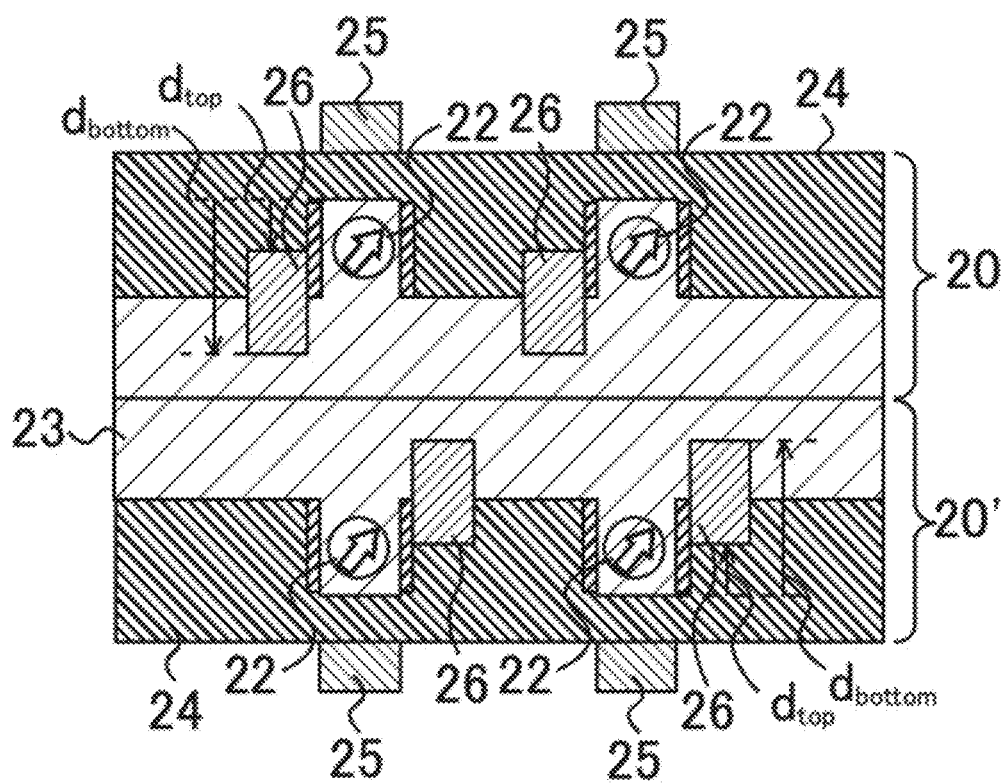
FIG. 21 is a sectional view showing a modification of the spin qubit-type semiconductor device according to the second embodiment.

Also, in the modification shown in FIG. 21, a spin qubit-type semiconductor device 20 and a spin qubit-type semiconductor device 20' equivalent thereto are formed on both the top and bottom surfaces of a semiconductor layer 23. Such a double-sided structure may be formed for one semiconductor layer 23, or two device structures formed separately may be formed by bonding the semiconductor layers 23 together.

Figure 22:
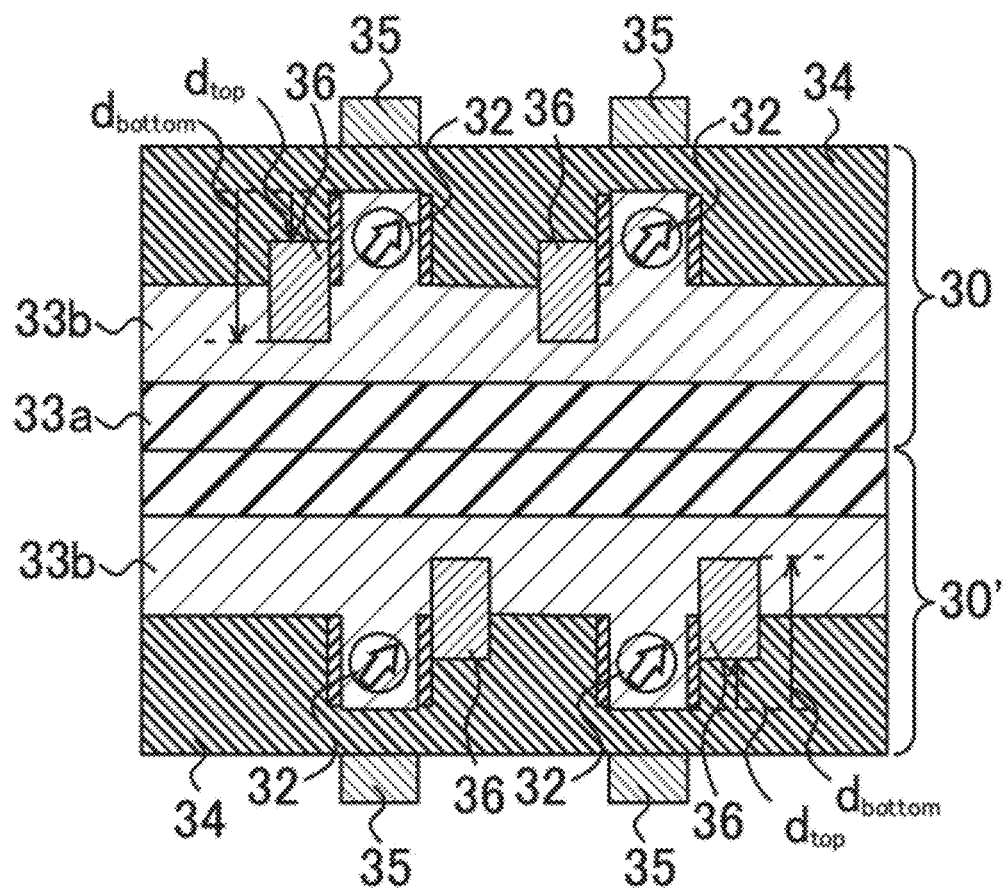
FIG. 22 is a sectional view showing a modification of the spin qubit-type semiconductor device according to the third embodiment.

Further, in the modification shown in FIG. 22, a spin qubit-type semiconductor device 30 and a spin qubit-type semiconductor device 30' equivalent thereto are formed on both the top and bottom surfaces of a substrate 33*a*. Such a double-sided structure may be formed for one substrate 33*a*, or may be formed by bonding two device structures formed separately together.

Incidentally, in these modifications, when the two device structures formed separately are formed by bonding, an arbitrary intermediate substrate is sandwiched in the middle, and the two device structures can also be bonded to both surfaces of the intermediate substrate.

Further, when one quantum dot (12, 22, 32) in these modifications is viewed, gate electrodes (15, 25, 35) are arranged one by one in the vertical direction. In this case, the surface of the semiconductor layer (13*b*, 23, 33*b*) on which the gate electrode (15, 25, 35) closest in distance to the target quantum dot (12, 22, 32) when viewed from the target quantum dot is arranged is taken as the upper surface, and the described items related to the vertical relationship described previously are applied. That is, the vertical relationship in the present specification is determined regardless of the top and bottom relationship determined by the action of gravity.

(Integrated Circuit)

It is a feature of an integrated circuit of the present invention that a plurality of the spin qubit-type semiconductor devices of the present invention are arranged and configured, a plurality of quantum dots are formed in one semiconductor layer formed in the same body, and the device structure of the spin qubit-type semiconductor device is formed for each quantum dot.

Figure 23:
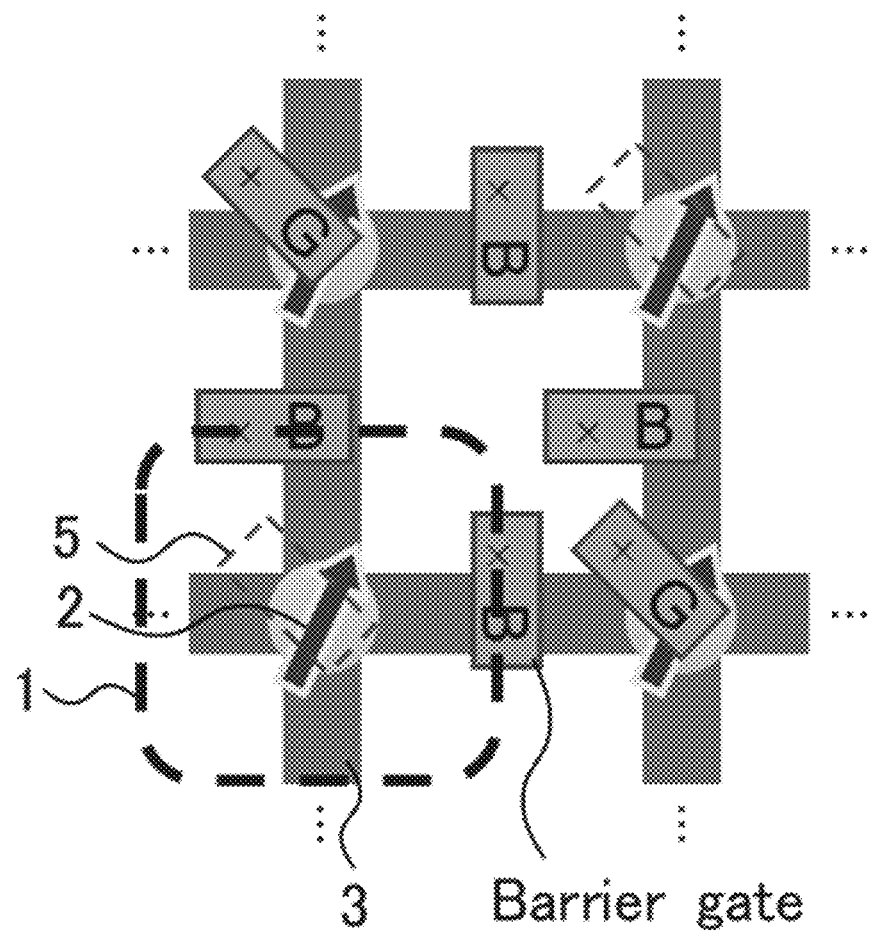
FIG. 23 is a top surface explanatory view showing an outline of an integrated circuit of a spin qubit-type semiconductor device according to the present invention.

A specific configuration of the integrated circuit may include, as illustrated in FIG. 23, a configuration in which a plurality of spin qubit-type semiconductor devices 1 (refer to FIG. 2) are arranged in a body 3 configured in a two-dimensional lattice manner through barrier gates.

EXAMPLES

In order to examine the effectiveness and suitable conditions of the present invention, a simulation test was conducted on the strength of the slanting magnetic field applied from the micro magnet to the quantum dot.

Figure 24A:
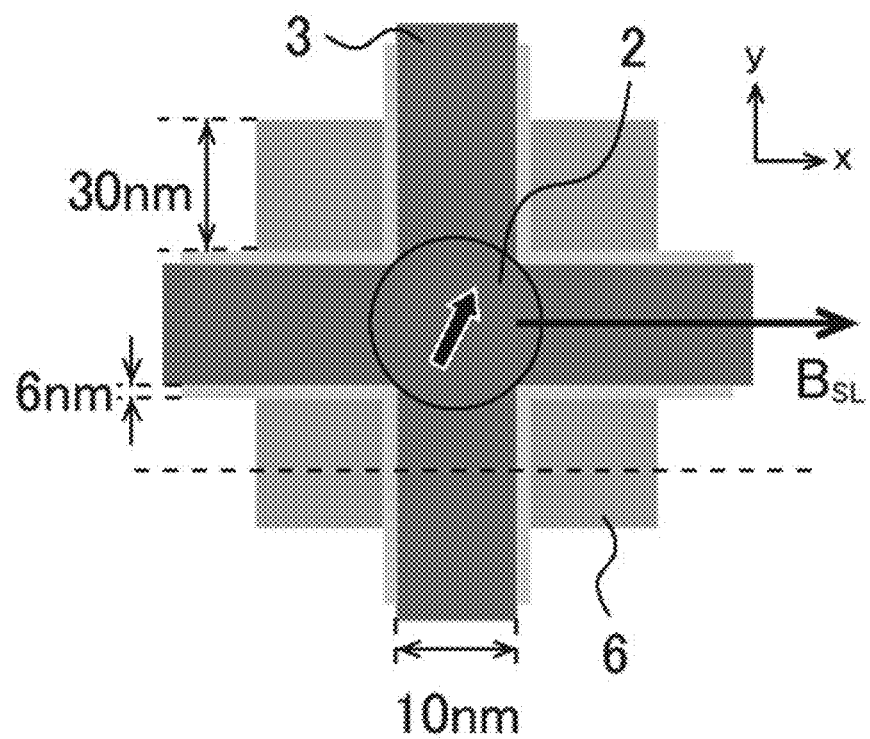
FIG. 24(a) is a top surface explanatory view showing an outline of a spin qubit-type semiconductor device related to the setting of a simulation test.
Figure 24B:
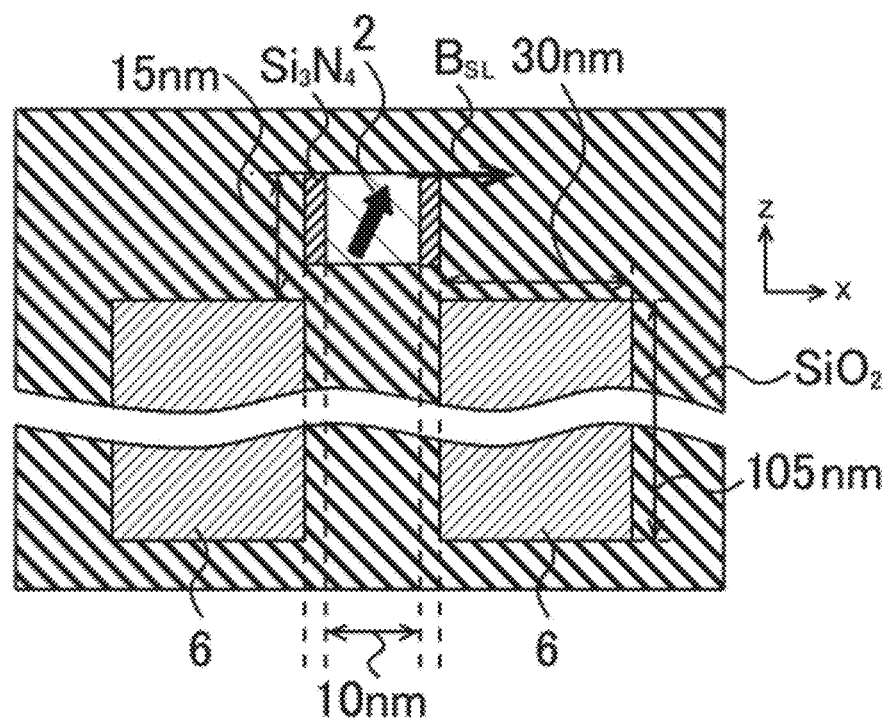
FIG. 24(b) is a partial sectional view showing the outline of the spin qubit-type semiconductor device related to the setting of the simulation test.

In the simulation test, the spin qubit-type semiconductor device shown in FIGS. 24(*a*) and 24(*b*) is basically assumed. FIG. 24(*a*) is a top surface explanatory view showing an outline of the spin qubit-type semiconductor device related to the setting of the simulation test. FIG. 24(*b*) is a partly sectional view showing the outline of the spin qubit-type semiconductor device related to the setting of the simulation test. Incidentally, the reference numerals in these figures conform to FIG. 2.

Specifically, a configuration is assumed that two fin-shaped Si semiconductor layers each formed as a linear layer having a line width of 10 nm are configured in a cross shape in which the semiconductor layers are crossed in orthogonal directions, and the quantum dot 2 is formed at the intersection point of the cross shape (refer to FIG. 24(*a*)). A body 3 is configured to have the semiconductor layers and an $SiO_2$ region covering the semiconductor layers (refer to FIG. 24(*b*)).

A configuration is assumed in which a micro magnet 6 is used as a cobalt magnet comprised of an equilateral quadrangular pillar with a depth of 30 nm, a width of 30 nm, and a height of 105 nm, and the micro magnet 6 is embedded at a position of a $SiO_2$ region hung down from the outermost side position of an $Si_3N_4$ sidewall covering the side surface of the body 3 with its sidewall thickness as 6 nm so that the side surface of the micro magnet 6 on the side of the quantum dot 2 extends along the sidewall (refer to FIGS. 24(*a*) and 24(*b*)). Also, a configuration is assumed in which the height position of the upper end of the micro magnet 6 is 15 nm lower than the height position of the upper end of the semiconductor layer (refer to FIG. 24(*b*)). Incidentally, the micro magnet 6 is magnetized by an external magnetic field (a static magnetic field applied from the static magnetic field applying unit), and the direction of the external magnetic field is a z direction which is the height direction of the micro magnet 6. Also, the direction of the slanting magnetic field is an x direction which is the direction perpendicular to the external magnetic field.

Figure 25:
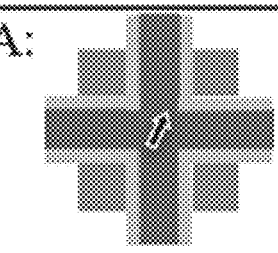
FIG. 25 is a view showing a relationship between arrangements A to E of micro magnets and slanting magnetic field strengths.

With this configuration as a basic configuration, the arrangements A to E of the micro magnets shown in FIG. 25 are assumed. For each of the spin qubit-type semiconductor devices according to these arrangements A to E, the three-dimensional distribution of a slanting magnetic field strength ($B_{SL}$) due to the micro magnet 6 is calculated, and a slanting magnetic field strength ($B_{SL0}$) at the position of the quantum dot 2 is calculated. Incidentally, FIG. 25 is a view showing the relationship between the arrangements A to E of the micro magnets and the slanting magnetic field strength.

The calculation is performed by numerically solving Maxwell's equations with the Coulomb gauge condition. For the calculation, numerical calculation software Impulse TCAD (Development of National Institute of Advanced Industrial Science and Technology) implemented with functions for solving the Maxwell's equations was used.

The five arrangements of the micro magnets 6 shown in FIG. 25 are for verifying the arrangement effects of the micro magnets 6 with respect to the quantum dots 2 when the spin qubit-type semiconductor devices are viewed from above. All of the arrangements of the micro magnets 6 with respect to the four corners of the quantum dot 2 are taken into consideration by adding the same arrangement after rotating by an integral multiple of 90 degrees as an equivalent arrangement.

Figure 26:
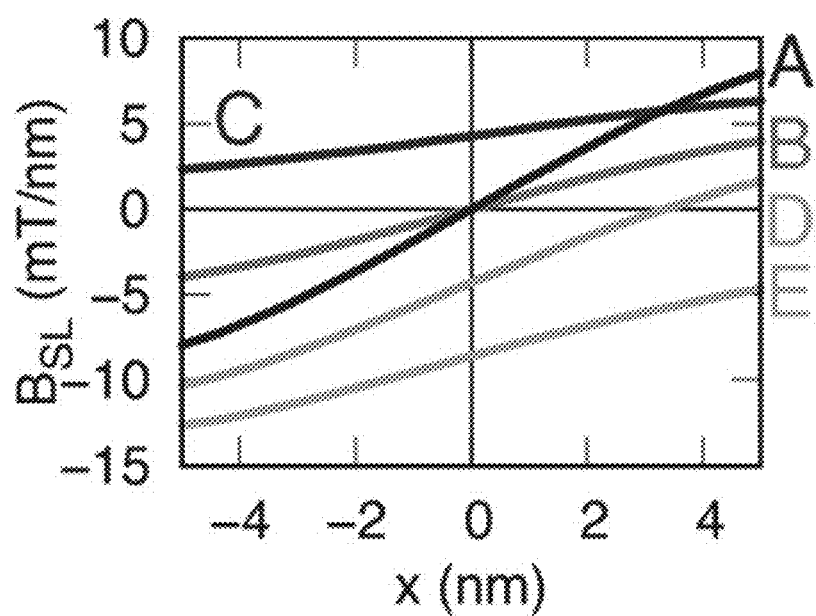
FIG. 26 is a view showing a relationship between the arrangements A to E of the micro magnets and slanting magnetic field distributions.

FIG. 26 shows the relationship between the arrangements A to E of the micro magnets 6 obtained by calculation and slanting magnetic field distributions. Incidentally, in FIG. 26, the horizontal axis indicates a displacement position in the x direction with the center position of the quantum dot 2 in the x direction (refer to FIGS. 24(*b*) and 25) as the origin, and the vertical axis indicates a slanting magnetic field strength with the slanting magnetic field strength applied in the positive direction of the x-axis of FIG. 24(*a*) as a positive value and the slanting magnetic field strength applied in the negative direction of the x-axis of FIG. 24(*a*) as a negative value. The arrangement with the largest absolute value gives the quantum dot 2 the strongest slanting magnetic field strength.

As can be confirmed from FIG. 26, in the arrangements A and B, the slanting magnetic field strength is 0 at the position of the quantum dot 2 due to symmetry. Also, among the three magnets included in the arrangement D, the two micro magnets 6 arranged diagonally correspond to the arrangement B. In order not to generate a slanting magnetic field at the position of the quantum dot 2, the arrangement D has the same slanting magnetic field strength as in the arrangement C when one micro magnet 6 is arranged. The slanting magnetic field strength formed by the arrangement E at the position of the quantum dot 2 is equivalent to twice the slanting magnetic field strength formed by one micro magnet 6, and the arrangement E becomes the condition under which the largest slanting magnetic field strength is obtained by the arrangement E among all arrangements.

In the spin qubit-type semiconductor device according to the present invention, as shown in Table 1 below, while using a magnet smaller in size than in the conventional technology (Non-Patent Documents 3 and 4), it is possible to obtain a slanting magnetic field strength being 5 to 10 times greater than in the conventional technology (Non-Patent Documents 3 and 4) (refer to the arrangement E).

In other words, this result shows that a slanting magnetic field strength as a strength not available in the conventional technology is obtained while eliminating a problem that the size (area) of the magnet becomes huge compared to the unit area (about several tens of nm×several tens of nm) required for formation of the device structure of one quantum dot 2, which hinders high integration.

TABLE 1

| | Non-Patent Document 3 | Non-Patent Document 4 | Present Invention |
|---|---|---|---|
| Slanting magnetic field strength (mT/nm) | 153 | 0.83 | 8.57 |
| Size of Magnet (nm$^2$) | 1000 × 1500 | 100 × 100 | 30 × 30(×2 pieces) |

Figure 27:
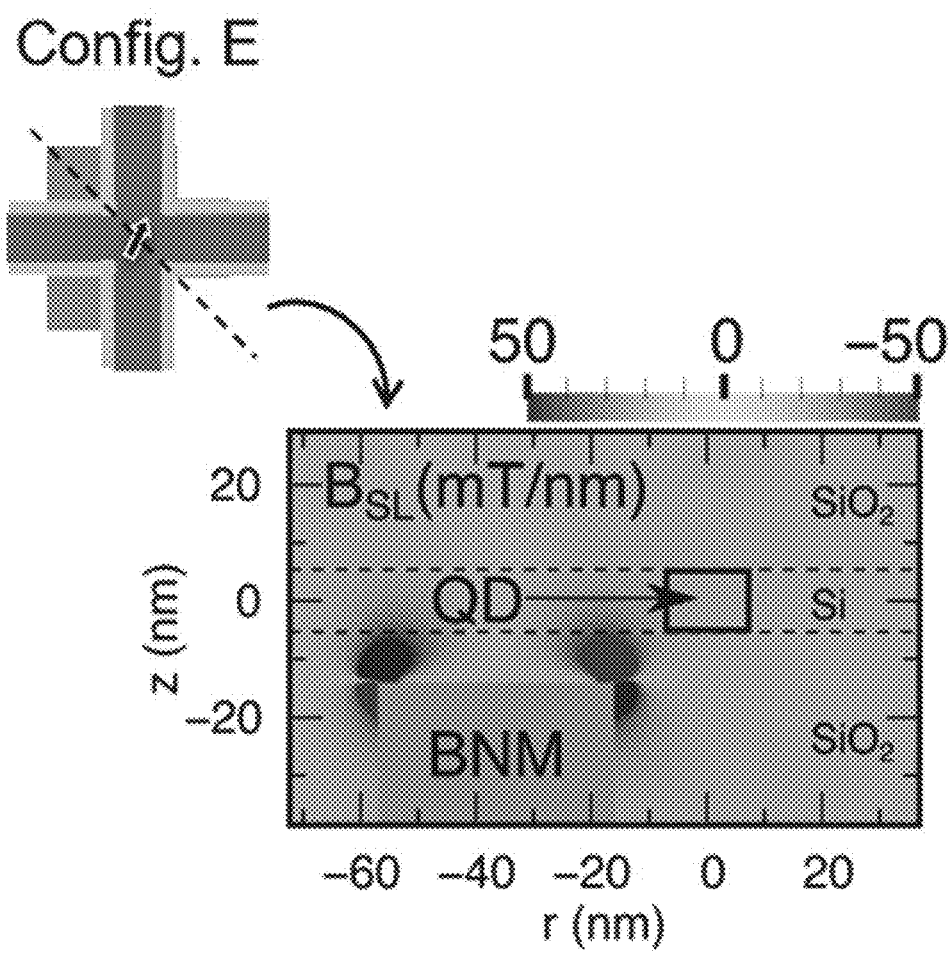
FIG. 27 shows a calculation result of a slanting magnetic field distribution in a diagonal position cross section of the arrangement E.

Next, FIG. 27 shows the result of calculation of the slanting magnetic field distribution in the cross section at the diagonal position of the arrangement E. In FIG. 27, the horizontal axis indicates a displacement (r) position in the diagonal direction with the center position of a quantum dot 2 (QD) in the diagonal direction (refer to the upper left in FIG. 27) as the origin. The vertical axis indicates a displacement (z) position in the height direction with the center position of the quantum dot 2 (QD) in the height direction (the z direction in FIG. 24(*b*)) as the origin. Further, a memory indicated by 50 to −50 ($B_{SL}$ (mT/nm)) in the upper right of the figure is a memory which indicates the strength of the slanting magnetic field in shades of color, and the darker the color, the stronger the strength of the slanting magnetic field.

As can be confirmed from FIG. 27, the strength of the slanting magnetic field is strong near the corner of the L-shaped cross section of the micro magnet 6 (BNM) and reaches its maximum at a position slightly displaced from the corner in the z direction. Therefore, when the electrons in the quantum dot 2 are spun using the slanting magnetic field formed near the corner on the upper end side of the micro magnet 6, it is preferable to set the position of the corner of the micro magnet 6 slightly above or below the upper surface of the quantum dot 2, i.e., the Si semiconductor layer.

Next, as for the arrangement E, when setting the position of the corner of the micro magnet 6 below the upper surface of the Si semiconductor layer (the quantum dot 2), it is verified how much lower it should be. In addition, it is verified to what extent the size of the micro magnets 6 should be.

Figure 28:
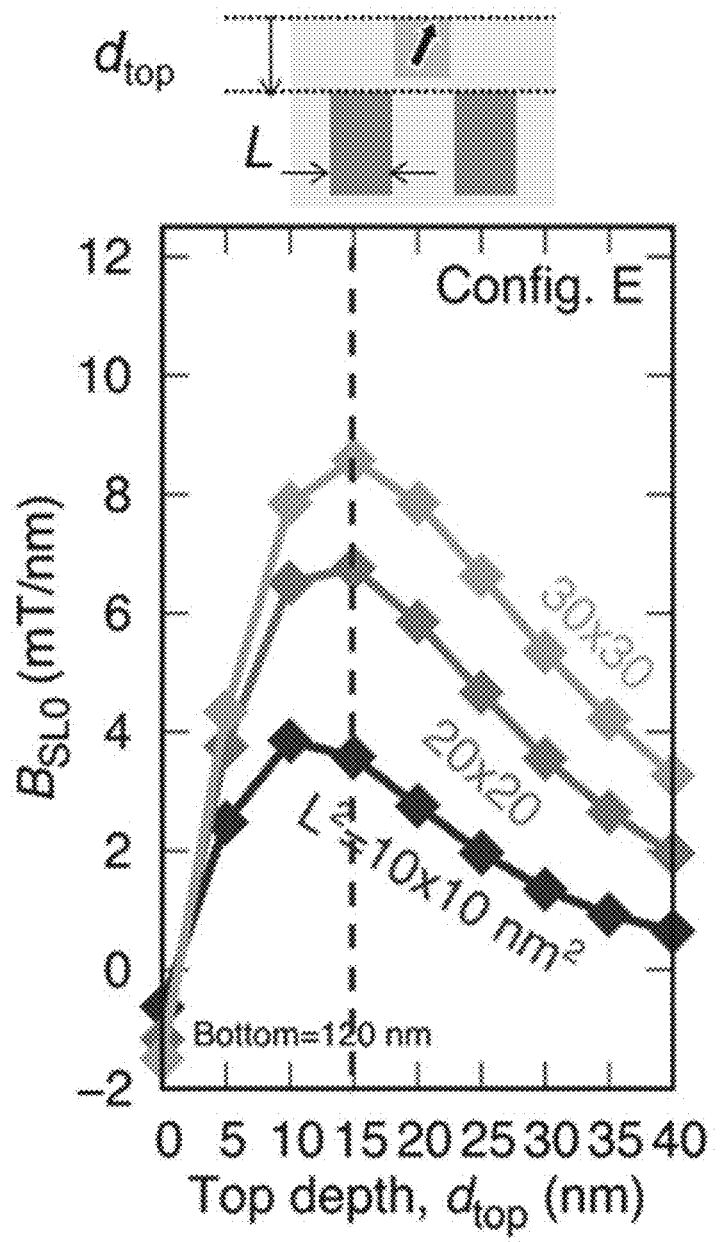
FIG. 28 shows simulation results of testing a relationship between a distance from an upper surface of a Si semiconductor layer to an upper surface of a micro magnet and the strength of a slanting magnetic field while changing the size of the micro magnet in the spin qubit-type semiconductor device according to the arrangement E.

FIG. 28 shows a simulation result in which in the spin qubit-type semiconductor device according to the arrangement E, the relationship between the distance from the upper surface of the Si semiconductor layer to the upper surface of the micro magnet 6 and the slanting magnetic field strength was tested while changing the size of the micro magnet 6. In FIG. 28, Top Depth ($d_{top}$) indicates the distance from the upper surface of the Si semiconductor layer to the upper surface of the micro magnet 6, $B_{SL0}$ indicates the slanting magnetic field strength ($B_{SL0}$) at the position of the quantum dot 2, L indicates the length of one side of the upper surface (bottom surface) of the micro magnet 6, and $L^2$ (depth× width) indicates the area of the upper surface (bottom surface). Incidentally, the height of the micro magnet 6 (refer to FIG. 24(*b*)) in this simulation test remains 105 nm.

As can be confirmed from FIG. 28, when the position of the corner is 5 nm to 25 nm below the upper surface of the Si semiconductor layer (quantum dot 2) even in the micro magnet 6 of any area ($L^2$), the slanting magnetic field strength remarkably rises. In particular, it can be seen that the condition that the position of the corner is 10 nm to 20 nm below the upper surface of the Si semiconductor layer (quantum dot 2) is optimum.

In addition, under these conditions, even when the area of the top surface (bottom surface) of the micro magnet 6 is the smallest ($L^2$=10×10 (nm$^2$)), the slanting magnetic field strength as the strength surpassing the slanting magnetic field strength (Table 1) in the prior art is obtained.

Figure 29:
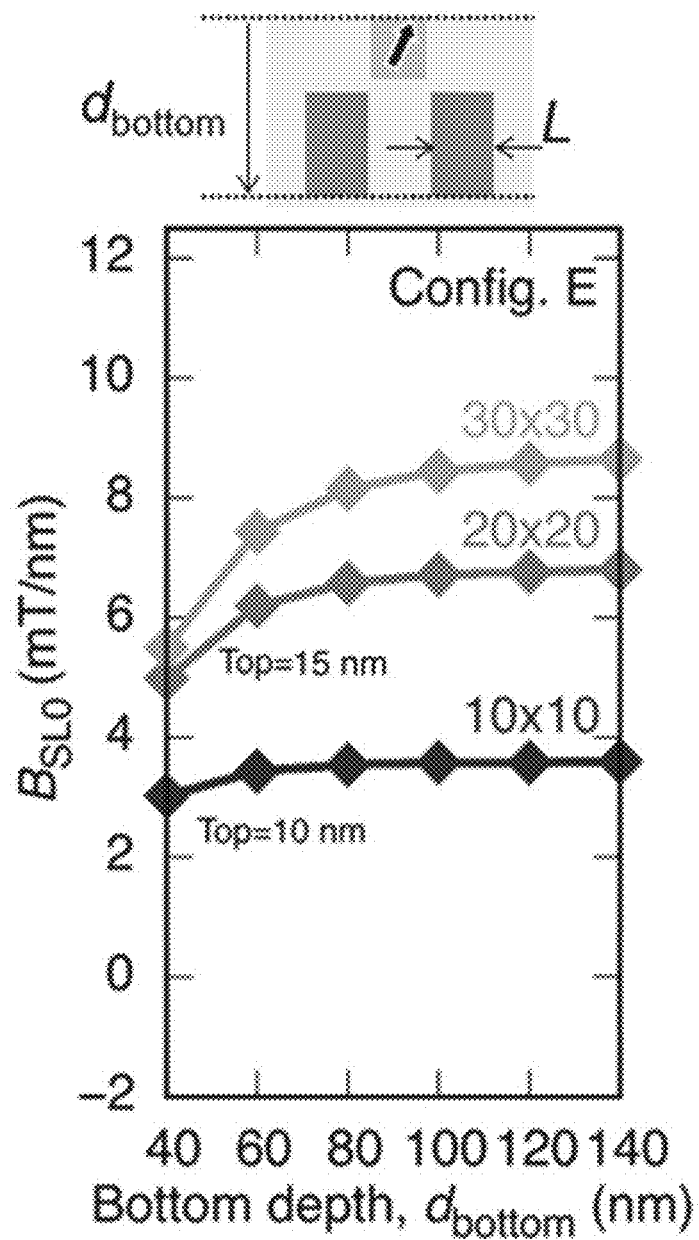
FIG. 29 shows simulation results of testing a relationship between a distance from the upper surface of the Si semiconductor layer to the bottom surface of the micro magnet and the strength of a slanting magnetic field while changing the size of the micro magnet in the spin qubit-type semiconductor device according to the arrangement E.

Next, FIG. 29 shows a simulation result in which in the spin qubit-type semiconductor device according to the arrangement E, the relationship between the distance from the top surface of the Si semiconductor layer to the bottom surface of the micro magnet 6 and the strength of the slanting magnetic field was tested while changing the size of the micro magnet 6. In FIG. 29, Bottom Depth ($d_{bottom}$) indicates the distance from the top surface of the Si semiconductor layer to the bottom surface of the micro magnet 6, and $B_{SL0}$ and L are the same as those described in FIG. 28. In the present simulation test, the size of the micro magnet 6 in the height direction is of concern.

Incidentally, the simulation with $L^2$=10×10 (nm$^2$) is performed under the condition that $d_{top}$ (refer to FIG. 28) is set to 10 nm, and each simulation with $L^2$=20×20 (nm$^2$) and $L^2$=30×30 (nm$^2$) is performed under the condition that $d_{top}$ (refer to FIG. 28) is set to 15 nm.

As can be confirmed from FIG. 29, it can be seen that for any area ($L^2$) of the micro magnet 6, the slanting magnetic field strength does not change significantly in a depth range where Bottom depth ($d_{bottom}$) is 100 nm or more, and if the size in the height direction of the micro magnet 6 where the position of the bottom surface of the micro magnet 6 is 100 nm or more below the top surface of the Si semiconductor layer is set, almost maximum slanting magnetic field strength can be obtained.

REFERENCE SIGNS LIST

1, 10, 10', 20, 20', 30, 30' spin qubit-type semiconductor element
2, 12, 22, 32, 102 quantum dot
3, 103 body
4, 14, 14', 24, 34, 104 gate insulating layer
5, 15, 15', 25, 35, 105 gate electrode
6,16,26,36 micro magnet
13*a*, 33*a* substrate
13*b*, 13*b'*, 23, 33*b* semiconductor layer
13*c* reservoir
17 source electrode
18 drain electrode
18' reservoir electrode
19 barrier electrode
100 spin qubit
106 magnet.

What is claimed is:

1. A spin qubit-type semiconductor device comprising:
a body comprised of at least one of a semiconductor layer itself formed with a quantum dot and a structural portion arranged around the semiconductor layer;
a gate electrode arranged at a position on the semiconductor layer, which faces the quantum dot;
at least one micro magnet wholly or partly embedded in the body so that a first position condition in which the micro magnet is at a position near the quantum dot, a second position condition in which when viewing up and down of the micro magnet with a surface of the semiconductor layer on the side closer to the gate electrode being taken as an upper surface and a surface facing the upper surface being taken as a lower surface, the position of a lower end of the micro magnet is located below the gate electrode, and a third position condition in which when viewed from above the body, the micro magnet is arranged at a position having no rotational symmetry with the quantum dot as the center of rotation are satisfied; and
a static magnetic field applying unit capable of applying a static magnetic field to the quantum dot and the micro magnet.

2. The spin qubit-type semiconductor device according to claim 1, wherein the position of an upper end of the micro magnet is below the gate electrode.

3. The spin qubit-type semiconductor device according to claim 2, wherein at least an upper end portion of the micro magnet on the side near the quantum dot is shaped to have an L-shaped corner in a vertical cross section.

4. The spin qubit-type semiconductor device according to claim 3, wherein the position of the corner is 5 nm to 25 nm below the upper surface of the semiconductor layer.

5. The spin qubit-type semiconductor device according to claim 3, wherein the micro magnet is formed as a quadrangular prism erected along the vertical direction, the maximum diameter of an upper surface of the micro magnet is set to 10 μm or less, and the area of the top surface is set to 100 μm$^2$ or less.

6. The spin qubit-type semiconductor device according to claim 1, wherein when the semiconductor layer is viewed from above the body, the semiconductor layer is configured as a cross shape in which two linear layers are crossed in orthogonal directions, and the quantum dot is formed at an intersection point of the cross shape, and
wherein the micro magnets are arranged at positions facing each other with one of the linear layers interposed therebetween when viewed from above the body.

7. The spin qubit-type semiconductor device according to claim 1, wherein a material for forming the micro magnet contains at least any element of iron, cobalt, nickel, and manganese.

8. An integrated circuit having a plurality of the spin qubit-type semiconductor devices according to claim 1 which are brought into integration, wherein a plurality of quantum dots are formed in one semiconductor layer formed in the same body, and a device structure of the spin qubit-type semiconductor device is formed for each quantum dot.

* * * * *